(12) United States Patent
Sharma et al.

(10) Patent No.: US 10,347,822 B1
(45) Date of Patent: Jul. 9, 2019

(54) FABRICATION METHODS OF FORMING CYLINDRICAL VERTICAL SI ETCHED CHANNEL 3D SWITCHING DEVICES

(71) Applicant: Spin Memory, Inc., Fremont, CA (US)

(72) Inventors: Gian Sharma, Fremont, CA (US); Amitay Levi, Cupertino, CA (US); Andrew J. Walker, Mountain View, CA (US); Kuk-Hwan Kim, San Jose, CA (US); Dafna Beery, Palo Alto, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/857,358

(22) Filed: Dec. 28, 2017

(51) Int. Cl.
*H01L 27/22* (2006.01)
*H01L 43/02* (2006.01)
*H01L 43/12* (2006.01)

(52) U.S. Cl.
CPC ............ *H01L 43/02* (2013.01); *H01L 27/228* (2013.01); *H01L 43/12* (2013.01)

(58) Field of Classification Search
CPC ........ H01L 43/02; H01L 27/228; H01L 43/12
See application file for complete search history.

(56) References Cited

U.S. PATENT DOCUMENTS

| | | | | |
|---|---|---|---|---|
| 2012/0012913 A1* | 1/2012 | Lee | ................... | H01L 27/10852 257/302 |
| 2012/0052640 A1* | 3/2012 | Fischer | ........... | H01L 21/823425 438/268 |
| 2015/0279933 A1* | 10/2015 | Xiao | ................... | H01L 21/2252 257/400 |
| 2018/0040740 A1* | 2/2018 | Cantoro | .......... | H01L 21/823807 |
| 2018/0069087 A1 | 3/2018 | Georgescu et al. | | |

OTHER PUBLICATIONS

Sharma et al., U.S. Appl. No. 15/857,430, filed Dec. 28, 2017.
Restriction Requirement from U.S. Appl. No. 15/857,430, dated Jun. 15, 2018.
Non-Final Office Action from U.S. Appl. No. 15/857,430, dated Jan. 24, 2019.
Notice of Allowance from U.S. Appl. No. 15/857,430, dated Feb. 21, 2019.

* cited by examiner

*Primary Examiner* — Errol V Fernandes
(74) *Attorney, Agent, or Firm* — Zilka-Kotab, P.C.

(57) ABSTRACT

A method of forming a cylindrical vertical transistor; the method, according to one embodiment, includes: forming a cylindrical pillar from a single block of silicon, forming an oxide layer over an exterior of the cylindrical pillar and exposed surfaces of the block of silicon, coating the oxide layer with a spin-on-glass (SOG), depositing a source mask over a majority of the SOG coating, and removing a portion of the SOG coating and underlying oxide layer, where the portion removed is defined by the source mask. Other systems and methods are also described in additional embodiments herein which provide various different improved processes of forming the cylindrical gate contacts, the source contacts, and/or the drain contacts for vertical transistor structures which also include the aforementioned cylindrical pillar channel structures and cylindrical gate in comparison to conventional surface transistor structures.

14 Claims, 15 Drawing Sheets

FABRICATION METHODS OF FORMING CYLINDRICAL VERTICAL SI ETCHED CHANNEL 3D SWITCHING DEVICES

FIELD OF THE INVENTION

The present invention relates to magnetoresistive random-access memory (MRAM), and more particularly, this invention relates to increasing the effective storage density of MRAM, as well as enhancing the operational range of performance, ease, speed, capabilities, etc., of MRAM devices and also various other switching and storage devices.

BACKGROUND

MRAM is a non-volatile memory technology that stores data through magnetic storage elements. Because MRAM is non-volatile, memory written thereto may be retained even when the power supply of the MRAM is turned off. The magnetic storage elements used to actually store the data include two ferromagnetic plates, or electrodes, that can hold a magnetic field and are separated by a non-magnetic material, such as a non-magnetic metal or insulator. In general, one of the plates is referred to as the reference layer and has a magnetization which is pinned. In other words, the reference layer has a higher coercivity than the other plate and requires a larger magnetic field or spin-polarized current to change the orientation of its magnetization. The second plate is typically referred to as the free layer whose magnetization direction which can be changed by relatively smaller magnetic fields or a spin-polarized current relative to the reference layer.

MRAM devices store information by storing the orientation of the magnetization of the free layer. In particular, based on whether the free layer is in a parallel or anti-parallel alignment relative to the reference layer, either a logical "1" or a logical "0" can be stored in each respective MRAM cell. Due to the spin-polarized electron tunneling effect, the electrical resistance of a memory element changes due to the orientation of the magnetic fields of the two layers. The resistance of a cell will be different for the parallel and anti-parallel states and thus the cell's resistance can be used to distinguish between a logical "1" and a logical "0".

An important and continuing goal in the data storage industry is that of increasing the density of data stored on a medium. For storage devices which implement MRAM, that goal has led to decreasing the footprint of individual MRAM cells in an attempt to further increase the storage capacity per unit area. However, the development of smaller MRAM cells has reached a limit which has effectively restricted conventional MRAM storage from further increasing storage density. Moreover, other types of random access memory are unable to achieve a storage density which rivals that of MRAM. For example, looking to FIGS. 1A-1B, a conventional transistor dynamic random access memory (DRAM) cell 100 is shown. Various components included in the DRAM cell are called out in FIGS. 1A-1B as would be appreciated by one skilled in the art.

SUMMARY

A method of forming a cylindrical vertical transistors; the method, according to one embodiment, includes: forming a cylindrical pillar from a single block of silicon, forming an oxide layer over an exterior of the cylindrical pillar and exposed surfaces of the block of silicon, coating the oxide layer with a spin-on-glass (SOG), depositing a source mask over a majority of the SOG coating, and removing a portion of the SOG coating and underlying oxide layer. The portion removed is defined by the source mask. Moreover, removing the portion of the SOG coating and underlying oxide layer forms a source contact recess which abuts a base of the cylindrical pillar and extends to the silicon block therebelow. Furthermore, the method also includes ion-implanting the exposed silicon substrate at a base of the source contact recess, and depositing a silicide material in the source contact recess, thereby forming a source contact.

Other aspects and advantages of the present invention will become apparent from the following detailed description, which, when taken in conjunction with the drawings, illustrate by way of example the principles of the invention.

DETAILED DESCRIPTION

Figure 1:
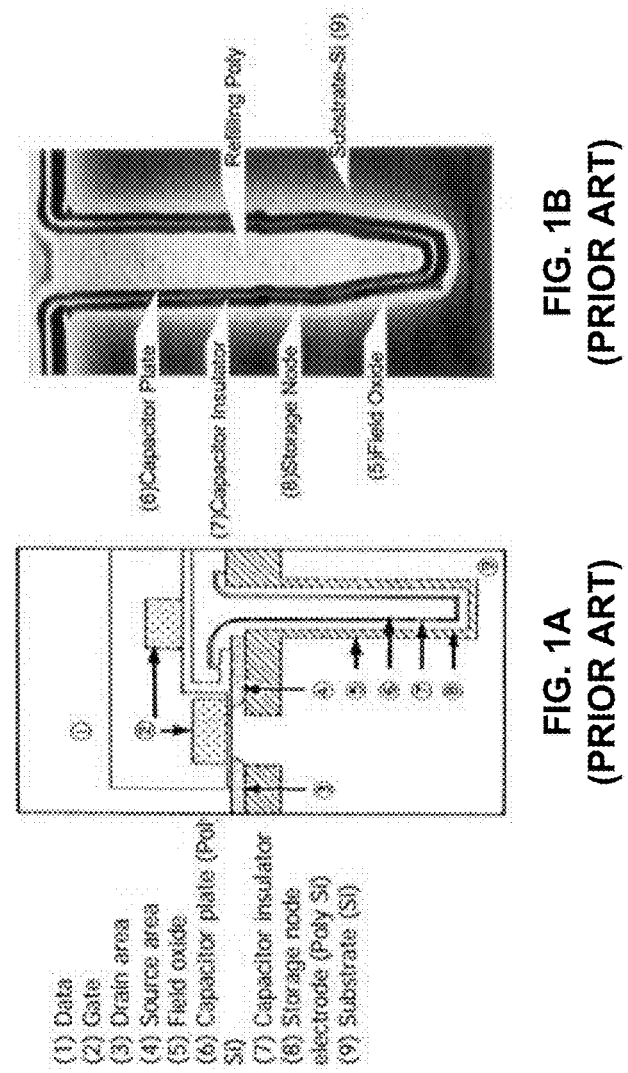
FIGS. 1A-1B are representational views of one transistor DRAM cell according to the prior art.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of MRAM having improved data storage density and capabilities and/or related systems and methods.

In one general embodiment, a method of forming a cylindrical vertical transistors includes: forming a cylindrical pillar from a single block of silicon, forming an oxide layer over an exterior of the cylindrical pillar and exposed surfaces of the block of silicon, coating the oxide layer with a spin-on-glass (SOG), depositing a source mask over a majority of the SOG coating, and removing a portion of the SOG coating and underlying oxide layer. The portion removed is defined by the source mask. Moreover, removing the portion of the SOG coating and underlying oxide layer forms a source contact recess which abuts a base of the cylindrical pillar and extends to the silicon block therebelow. Furthermore, the method also includes ion-implanting the exposed silicon substrate at a base of the source contact recess, and depositing a silicide material in the source contact recess, thereby forming a source contact.

As previously mentioned, MRAM devices store information by changing the orientation of the magnetization of the free layer. In particular, based on whether the free layer is in a parallel or anti-parallel alignment relative to the reference layer, either a logical "1" or a logical "0" can be stored in each respective MRAM cell. Due to the spin-polarized electron tunneling effect, the electrical resistance of a cell changes due to the orientation of the magnetic fields of the two layers. The resistance of a cell will be different for the parallel and anti-parallel states and thus the cell's resistance can be used to distinguish between a logical "1" and a logical "0".

Spin transfer torque or spin transfer switching, uses spin-aligned (polarized) electrons to change the magnetization orientation of the free layer in the MTJ. In general, electrons possess a spin, which is a quantized amount of angular momentum intrinsic to the electron. An electrical current is generally not polarized, in that it generally includes of 50% spin up and 50% spin down electrons. However, passing a current though a magnetic layer polarizes electrons in the current with the spin orientation corresponding to the magnetization direction of the magnetic layer. Thus, the magnetic layer acts as a polarizer and produces a spin-polarized current as a result. Moreover, if a spin-polarized current is passed to the magnetic region of a free layer in the MTJ device, the electrons will transfer a portion of their spin-angular momentum to the target magnetization layer to produce a torque on the magnetization of the target free layer. Thus, this spin transfer torque can switch the magnetization of the free layer, thereby effectively writing either a logical "1" or a logical "0" based on whether the free layer is in the parallel or anti-parallel states relative to the reference layer.

Figure 2:
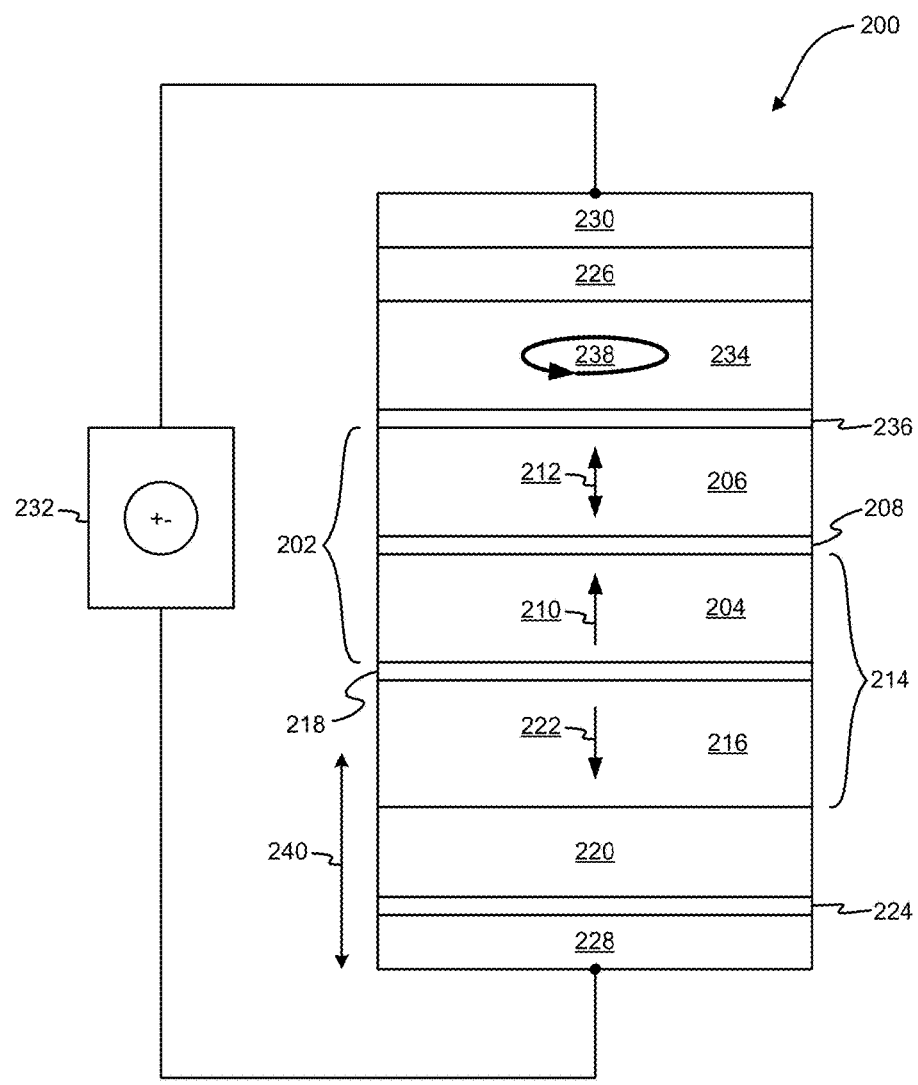
FIG. 2 is a representational view of a sensor stack for a MRAM memory element according to one embodiment.

Referring to FIG. 2, an illustrative sensor stack for a MTJ memory element 200 is shown according to one embodiment. The MTJ memory element 200 may be used in a p-MTJ memory element, as described in various embodiments herein. The MTJ memory element 200 may include a MTJ 202 that may include a magnetic reference layer 204, a magnetic free layer 206, and a thin, non-magnetic, electrically-insulating magnetic tunnel barrier layer 208 positioned between the reference layer 204 and the free layer 206 in a layer thickness direction 240. The tunnel barrier layer 208 may include an oxide, such as MgO, $Al_2O_3$, etc., or some other suitable material known in the art. The reference layer 204 has a magnetization 210 that is fixed in a direction that is perpendicular to a horizontal plane of the layer, as indicated by the arrow. The horizontal plane is sometimes referred to as a plane of formation in the embodiments described herein. The free layer 206 has a magnetization 212 that may be in either of two directions perpendicular to a horizontal plane of the free layer 206, as indicated by the two arrows. While the magnetization 212 of the free layer 206 remains in either of two directions perpendicular to the plane of the free layer 206 in a quiescent state, it may be selectable switched between these two directions, as is described in greater detail herein. When the magnetization 212 of the free layer 206 is in the same direction as the magnetization 210 of the reference layer 204, the electrical resistance across the MTJ 202 is at a low resistance state. Conversely, when the magnetization 212 of the free layer 206 is opposite to the magnetization 210 of the reference layer 204, the electrical resistance across the MTJ 202 is in a high resistance state.

The reference layer 204 may be part of an anti-parallel magnetic pinning structure 214 that may include a magnetic keeper layer 216 and a non-magnetic, antiparallel coupling layer 218 positioned between the keeper layer 216 and the reference layer 204 in the thickness direction 240. The antiparallel coupling layer 218 may include any suitable material known in the art, such as Ru, and may be constructed to have a thickness that causes ferromagnetic antiparallel coupling of the keeper layer 216 and the reference layer 204.

In one approach, the keeper layer 216 may be exchange coupled with an antiferromagnetic layer 220, which may include any suitable material known in the art, such as IrMn. Exchange coupling between the antiferromagnetic layer 220 and the keeper layer 216 strongly pins the magnetization 222 of the keeper layer 216 in a first direction. The antiparallel coupling between the keeper layer 216 and the reference layer 204 pins the magnetization 210 of the reference layer 204 in a second direction opposite to the direction of magnetization 222 of the keeper layer 216.

According to one approach, a seed layer 224 may be positioned below the keeper layer 216 in the thickness direction 240 to initiate a desired crystalline structure in the layers deposited thereabove.

In another approach, a capping layer 226 may be positioned above the free layer 206 to protect the underlying layers during manufacture, such as during high temperature annealing.

A lower electrode 228 and an upper electrode 230 may be positioned near a bottom and a top of the MTJ memory element 200, respectively, in one approach. The lower electrode 228 and the upper electrode 230 may be constructed of a non-magnetic, electrically conductive material of a type known in the art, such as Au, Ag, Cu, etc., and may provide an electrical connection with a circuit 232. The circuit 232 may include a current source, and may further include circuitry for reading an electrical resistance across the MTJ memory element 200.

The magnetic free layer 206 has a magnetic anisotropy that causes the magnetization 212 of the free layer 206 to remain stable in one of two directions perpendicular to the horizontal plane of the free layer 206. In a write mode of use for the MTJ memory element 200, the orientation of the magnetization 212 of the free layer 206 may be switched between these two directions by applying an electrical current through the MTJ memory element 200 via the circuit 232. A current in a first direction causes the magnetization 212 of the free layer 206 of the MTJ memory element 200 to flip to a first orientation, and a current in a second direction opposite to the first direction causes the magnetization 212 of the free layer 206 of the MTJ memory element 200 to flip to a second, opposite direction.

For example, if the magnetization 212 is initially oriented in an upward direction in FIG. 2, applying a current in a downward direction through the MTJ memory element 200 cause electrons to flow in an opposite direction upward through the MTJ memory element 200. Electrons travelling through the reference layer 204 become spin polarized as a result of the magnetization 210 of the reference layer 204. These spin-polarized electrons cause a spin torque on the magnetization 212 of the free layer 206, which causes the magnetization 212 to flip directions, from the upward direction to a downward direction.

On the other hand, if the magnetization 212 of the free layer 206 is initially in a downward direction in FIG. 2, applying an electrical current through the MTJ memory element 200 in an upward direction in FIG. 2 causes electrons to flow in an opposite direction, downward through the MTJ memory element 200. However, because the magnetization 212 of the free layer 206 is opposite to the magnetization 210 of the reference layer 204, the electrons will not be able to pass through the tunnel barrier layer 208. As a result, the electrons (which have been spin polarized by the magnetization 212 of the free layer 206) will accumulate at the junction between the free layer 206 and the tunnel barrier layer 208. This accumulation of spin polarized electrons causes a spin torque that causes the magnetization 212 of the free layer 206 to flip from the downward direction to an upward direction.

In order to assist the switching of the magnetization 212 of the free layer 206, the MTJ memory element 200 may include a spin polarization layer 234 positioned above the free layer 206. The spin polarization layer 234 may be separated from the free layer 206 by an exchange coupling layer 236. The spin polarization layer 234 has a magnetic anisotropy that causes it to have a magnetization 238 with a primary component oriented in the in plane direction (e.g., perpendicular to the magnetization 212 of the free layer and the magnetization 210 of the reference layer 204). The magnetization 238 of the spin polarization layer 234 may be fixed in one approach, or may move in a processional manner as shown in FIG. 2. The magnetization 238 of the spin polarization layer 234 causes a spin torque on the free layer 206 that assists in moving its magnetization 212 away from its quiescent state perpendicular to the plane of the free layer 206. This allows the magnetization 212 of the free layer 206 to more easily flip with less energy being utilized to flip the magnetization 212 in response to applying a write current to the MTJ memory element 200.

The MTJ memory element 200 described in FIG. 2 is intended to provide context to the various embodiments described herein. The structures and methods described herein in accordance with various embodiments may include a portion of the MTJ memory element 200 described in FIG. 2 and/or used in conjunction with the MTJ memory element 200, in various approaches.

It should be noted that the MTJ sensor stack configuration illustrated in FIG. 2 is in no way intended to limit the invention. Rather, the sensor stack included in MTJ memory element 200 of FIG. 2 is presented by way of example only. Accordingly, any of the embodiments described herein which include reference to a MTJ structure (e.g., sensor stack) may implement a MTJ sensor structure similar to or the same as that shown in FIG. 2, or any other MTJ sensor structure which would be apparent to one skilled in the art after reading the present description.

A MTJ sensor stack, e.g., such as that illustrated in FIG. 2, may be electrically coupled with a transistor in order to write information to the MTJ sensor stack such that the information is stored in the sensor stack itself. As previously mentioned, information may be written (or overwritten) to a MTJ sensor stack by causing the magnetic orientation of the free layer to flip. Moreover, flipping the magnetic orientation of the free layer may be achieved by selectively passing a current through the sensor stack, e.g., as will be described in further detail below.

Figure 3:
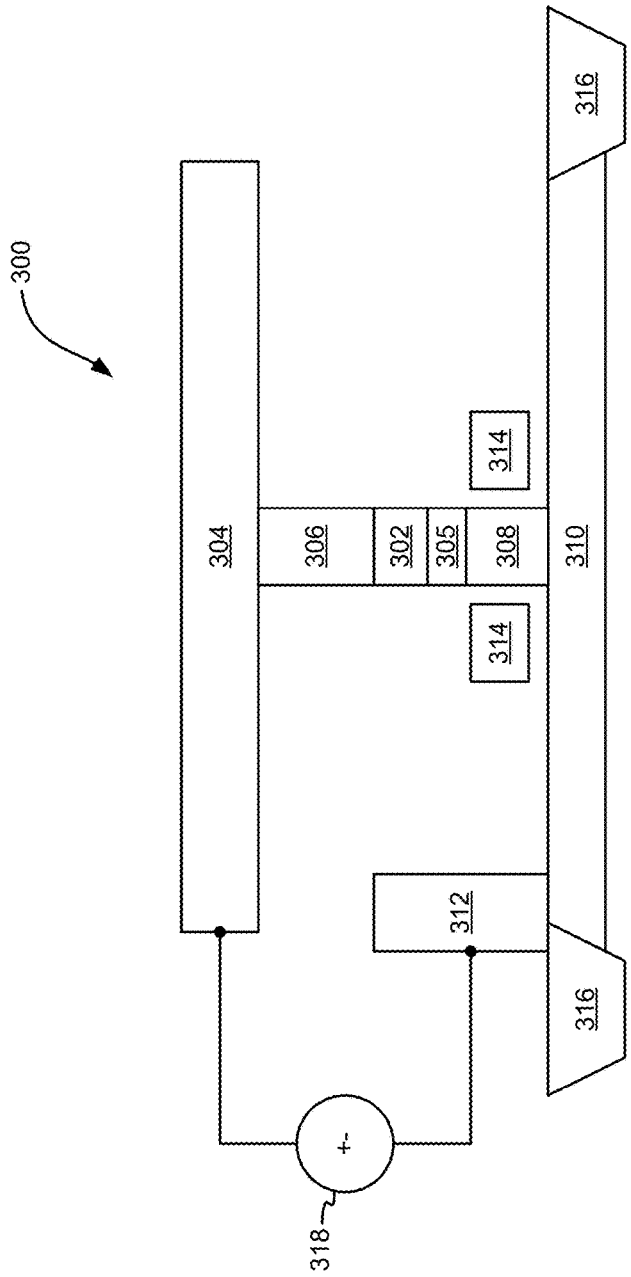
FIG. 3 is a schematic view of a perpendicular magnetic tunnel junction cell according to one embodiment.

Looking now to FIG. 3, a portion of a MRAM cell 300 that includes a magnetoresistive sensor stack 302 is shown according to one embodiment. The MRAM cell 300 may be operated and utilized as understood by those of skill in the art, with any special use cases being specified in accordance with an embodiment herein. The memory element 200 described in FIG. 2 may be used as the magnetoresistive sensor stack 302 of FIG. 3 in accordance with embodiments that store data in MRAM. In one embodiment, an MTJ element may be used as the magnetoresistive sensor stack 302.

The MRAM cell 300 also includes a bit line 304 that supplies current across the magnetoresistive sensor stack 302 from a current source 318. The bit line 304 may include any suitable material known in the art, such as TaN, W, TiN, Au, Ag, Cu, etc. An extension layer 306 electrically connects the magnetoresistive sensor stack 302 with the bit line 304. The extension layer 306 may include any suitable material known in the art, such as Ru, Ta, etc. A source line 305 is coupled between the magnetoresistive sensor stack 302 and a channel layer 308, the channel layer 308 further being in electrical contact with an n+ source layer 310. The channel layer 308 may include any suitable semiconductor material known in the art, such as Si, Ge, GaAs-compounds, etc. The n+ source layer 310 may include any suitable material known in the art, such as TaN, W, TiN, Au, Ag, Cu, etc., and is electrically connected to the current source 318 via a source line 318, which may include any suitable material known in the art, such as TaN, W, TiN, Au, Ag, Cu, etc. Positioned across the channel layer 308 is a word line 314 which may include any suitable material known in the art, such as TaN, W, TiN, Au, Ag, Cu, etc. On either side of the n+ source layer 310 are shallow trench isolation (STI) layers 316 which provide electrical insulation of the n+ source layer 310. Moreover, although not specifically shown, electrically insulative material may be positioned around the various layers shown in FIG. 3, as would be understood by one of skill in the art.

As previously mentioned, an important and continuing goal in the data storage industry is that of increasing the density of data stored on a medium. For storage devices which implement MRAM, that goal has led to decreasing the footprint of individual MRAM cells in an attempt to further increase the storage capacity per unit area. However, the development of smaller MRAM cells has reached a limit which has effectively restricted conventional MRAM storage from further increasing storage density. For instance, in semiconductor manufacturing processes, mostly planar metal oxide semiconductor (MOS) metal gate technologies are used. However, this technology offers a limited amount of achievable transistor drive current depending on the photo-lithographically defined gate width, gate length and/or other materials properties. Moreover, other types of random access memory are unable to achieve a storage density which rivals that of MRAM.

In sharp contrast, various ones of the approaches included herein are able to successfully improve the drive currents for the MRAM devices. This significant improvement to drive currents in MRAM devices may be achieved by flowing the operating current for MRAM cells in the vertical direction while using the same photolithography capability, e.g., as will be described in further detail below.

Figure 4A:
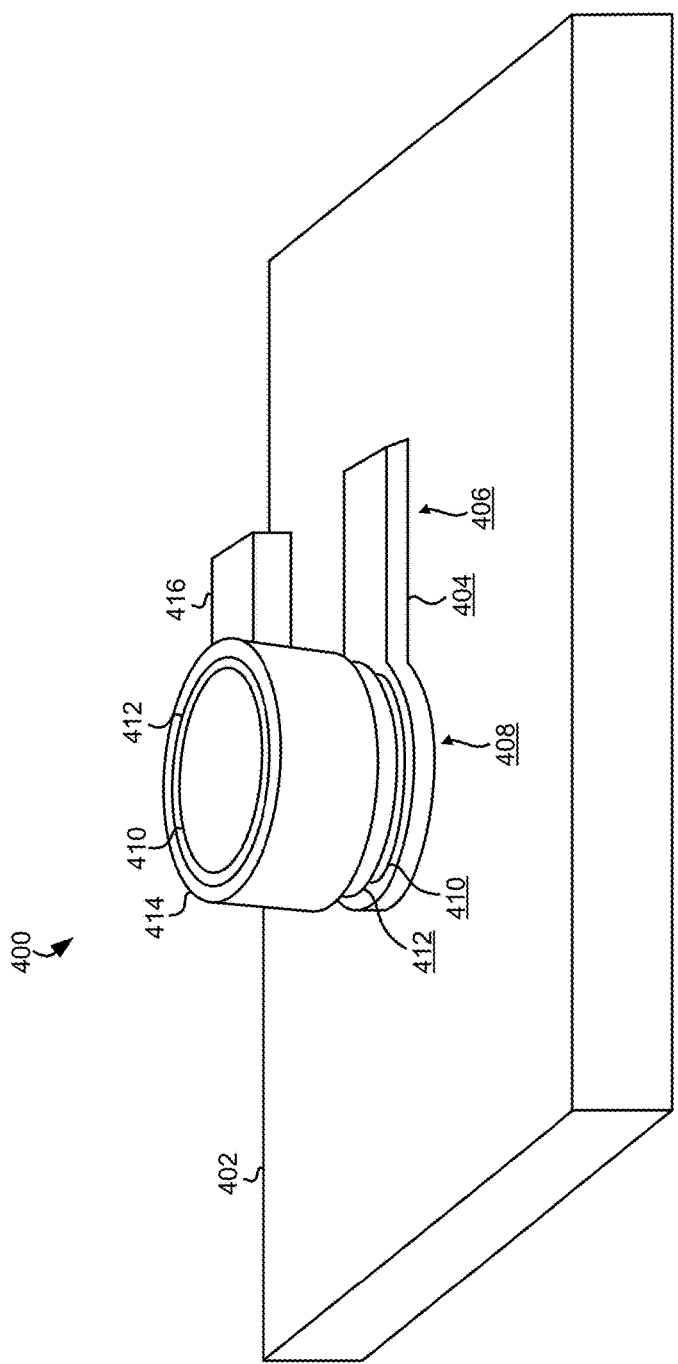
FIG. 4A is a partial perspective view of a vertical channel transistor structure according to one embodiment.

Referring now to FIG. 4A, a partial perspective view of a vertical channel transistor structure 400 is illustrated in accordance with one embodiment. As an option, the present transistor structure 400 may be implemented in conjunction with features from any other embodiment listed herein, such as those described with reference to the other FIGS., e.g., such as FIGS. 2-3. Of course, however, such transistor structure 400 and others presented herein may be used in various applications and/or in permutations which may or may not be specifically described in the illustrative embodiments listed herein. Further, the transistor structure 400 presented herein may be used in any desired environment.

The vertical channel transistor structure 400 is preferably formed from a solid block of material. Accordingly, the substrate 402 shown in FIG. 4A may actually be the remainder of a block of material used to form an underlying layer used to form the general resulting cylindrical pillar structure of the vertical channel transistor structure 400, e.g., according to the various processes described in method 500 of FIGS. 5A-5R below.

With continued reference to FIG. 4A, the substrate 402 preferably includes silicon. For example, in some approaches the substrate 402 may be a remaining portion of a <110> crystalline silicon wafer (or any other desired type of wafer material) used to form the vertical channel transistor structure 400. However, the substrate 402 may be a remaining portion of a different type of silicon and/or a different material altogether depending on the desired approach.

The transistor structure 400 also includes a source contact tab 404 which is directly coupled to the substrate 402. A portion 406 of the source contact tab 404 is shown as extending away from the general cylindrical pillar structure of the vertical channel transistor structure 400, while a base 408 of the source contact tab 404 encircles the general cylindrical pillar structure.

A channel 410 of the transistor structure 400 may serve as the drain contact thereof. Accordingly, the channel 410 may include an electrically conductive material which extends through the center of the transistor structure 400. According to preferred approaches, the channel 410 is actually formed from an original block of material as mentioned above, and therefore is actually a defined extension of the silicon substrate 402. In other words, although the substrate 402 and channel 410 are labeled differently, they are preferably portions of the same original block of material, e.g., as will be described in further detail below.

Although the channel 410 preferably extends through the center of the transistor structure 400, it should be noted that only portions of the channel 410 are shown in FIG. 4A because of the frame of reference afforded by the partial perspective view. Accordingly, the channel is shown between the base 408 of the source contact tab 404 and an oxide layer 412. Moreover, the channel 410 is also shown as extending to a top surface of the transistor structure 400. It follows that the channel 410 may also be used to couple the transistor structure 400 to a MTJ sensor stack in order to form a complete MRAM cell, e.g., as shown in FIG. 4B.

With continued reference to FIG. 4A, the oxide layer 412 encircles a majority of the channel 410, extending from a top surface of the transistor structure 400 almost to the source contact tab 404. Accordingly, the oxide layer 412 has a general cylindrical shape. Moreover, a cylindrical gate contact 414 encircles the oxide layer 412. A gate tab 416 is also electrically coupled to the cylindrical gate contact 414. The gate tab 416 is shown as extending away from the transistor structure 400, e.g., such that an electrical connection may be formed with the cylindrical gate contact 414 by drilling down to the gate tab 416 and forming a connection therewith. It follows that the gate tab 416 and the cylindrical gate contact 414 may include the same or similar materials. Moreover, in order to allow for a connection to also be formed to the source contact tab 404 by drilling from above, the gate tab 416 is shown as not extending away from the base 408 as far as the source contact tab 404 does.

Because the cylindrical gate contact 414 and the channel 410 (drain contact) are only separated by the oxide layer 412, it follows that the oxide layer 412 preferably serves as an electrical insulator. Accordingly, the oxide layer 412 may include electrically insulative materials in order to prevent the gate contact 414 and the channel 410 (drain contact) from shorting.

Figure 4B:
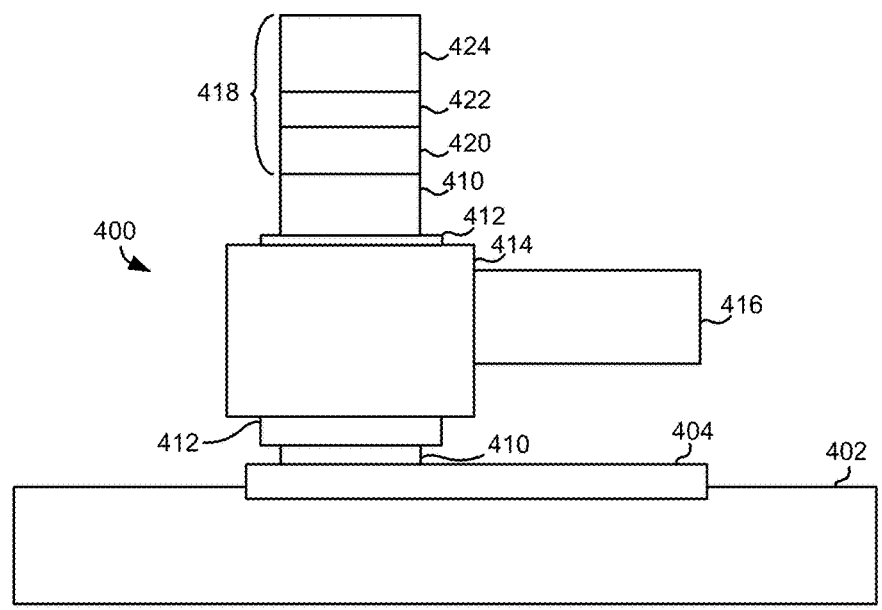
FIG. 4B is a partial cross-sectional view of the vertical channel transistor structure in FIG. 4A according to one embodiment.

Looking now to FIG. 4B, a non-cross-sectional side view of the vertical channel transistor structure 400 in FIG. 4A is shown having a MTJ sensor stack coupled thereto, in accordance with one embodiment. In other words, FIG. 4B illustrates an application-based variation of the embodiment of FIG. 4A. Accordingly, various components of FIG. 4B have common numbering with those of FIG. 4A. Moreover, it should be noted that the resulting structure illustrated in FIG. 4B may be implemented in conjunction with features from any other embodiment listed herein, such as those described with reference to the other FIGS.

As described above, the source contact tab 404 is directly coupled to the substrate 402. Moreover, although not shown in the present frame of reference in FIG. 4B, the channel 410 is preferably an extension of the substrate 402. As mentioned above, the channel 410 and substrate 402 may be effectively sculpted from an original solid block of material, and therefore are portions of the same original block of material despite having different reference numbers.

The cylindrical oxide layer 412 encircles a portion of the channel 410, thereby separating the channel 410 from the circular gate contact 414. As mentioned above, the cylindrical oxide layer 412 may include an electrically insulative later such that the channel 410 and circular gate contact 414 do not experience an electrical short therebetween. Furthermore, the gate tab 416 is coupled to the circular gate contact 414 and extends away from the transistor structure 400 in a lateral direction.

The thickness of the circular gate contact 414 may vary depending on desired performance characteristics of the vertical channel transistor structure 400 and/or threshold voltage requirements thereof. For example, the threshold voltage for n-type and p-type devices may be individually tailored by adjusting (e.g., selectively tuning) the dopant level used of the vertical channel transistor structure 400, the thickness of the circular gate contact 414, the dielectric constant of the circular gate contact 414, etc.

Again, the top portion of the channel 410 may serve as the drain contact for the transistor structure 400. Accordingly, the channel 410 is shown as extending in a vertical direction to meet a MTJ sensor stack 418. The MTJ sensor stack 418 may include any of the approaches described herein, e.g., such as those included in FIGS. 2-3. Thus, the MTJ sensor stack 418 may include at least a reference layer 420, a tunnel barrier layer 422, and a free layer 424 included therein. As described above, the magnetic orientation of the free layer 424 may be selectively set by applying a current to the MTJ sensor stack 418 in one of two directions through the layers thereof. By selectively setting the magnetic orientation of the free layer 424, a bit of data (logical "1" or logical "0") is written to the MTJ sensor stack 418 and stored therein.

The functional performance which the structural characteristics of the vertical channel transistor 400 illustrated in FIGS. 4A-4B provides are significant improvements compared to conventional products. Not only are the vertical transistor structures described herein able to successfully increase the drive currents used in the MRAM devices, but they are also able to increase the achievable storage density of the MRAM itself. As mentioned above, the increase in drive current is achieved by flowing the operating current in the vertical direction while using the same photolithography capability which increases the width of the channel from a lateral size "x" to a size of π(x). Moreover, by vertically arranging and constructing the various components of these transistors, the effective footprint of each MRAM cell is significantly reduced, thereby producing the increased storage density.

These significant improvements to performance of MRAM provide concrete evidence that the various approaches included herein overcome the shortcomings associated with conventional products. Moreover, these improvements are the result of the different components and resulting structures implemented in the vertical channel transistors included herein. Accordingly, the processes implemented to form these vertical channel transistors differ greatly from conventional surface transistor formation processes as well, e.g., as will soon become apparent.

Figure 5A:
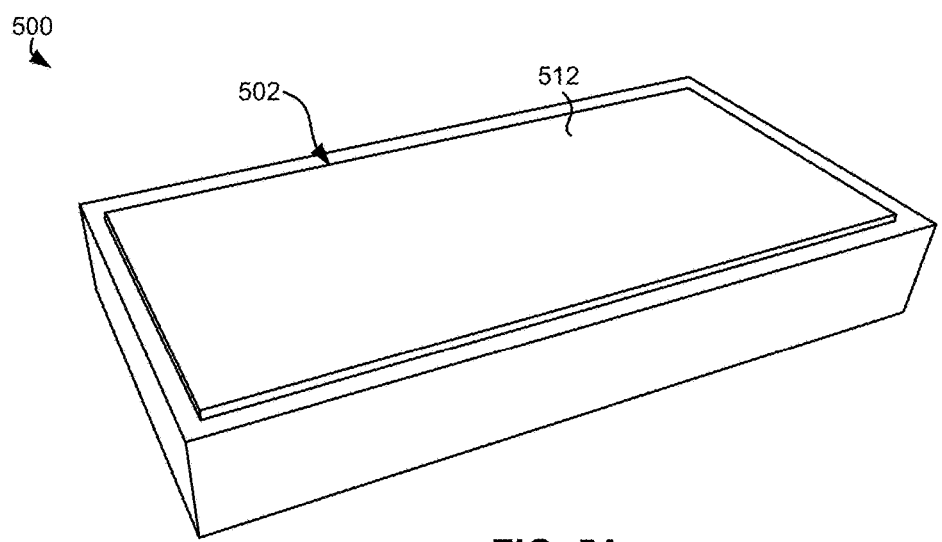
FIGS. 5A-5R are partial perspective views of a method for forming a vertical channel transistor structure according to one embodiment.
Figure 5B:
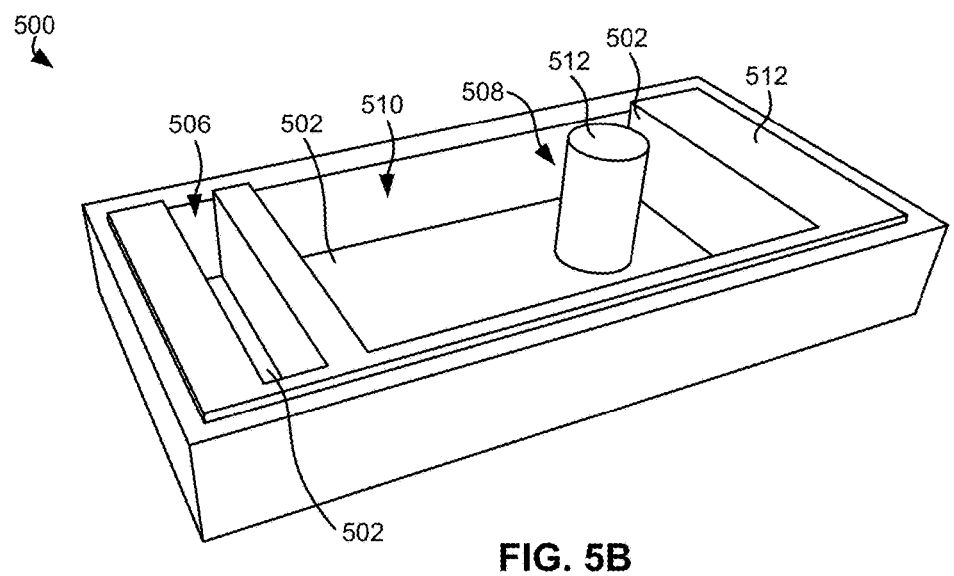
Figure 5C:
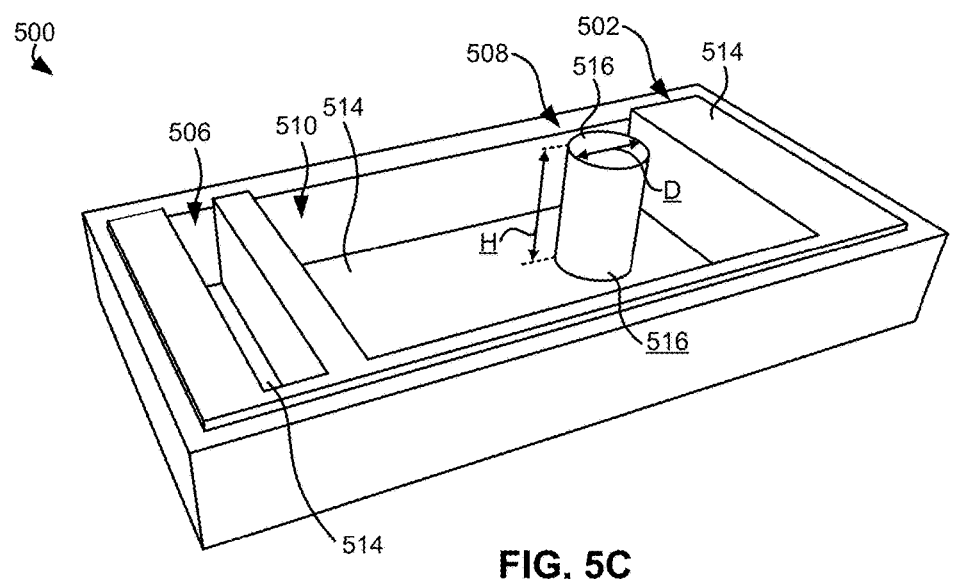
Figure 5D:
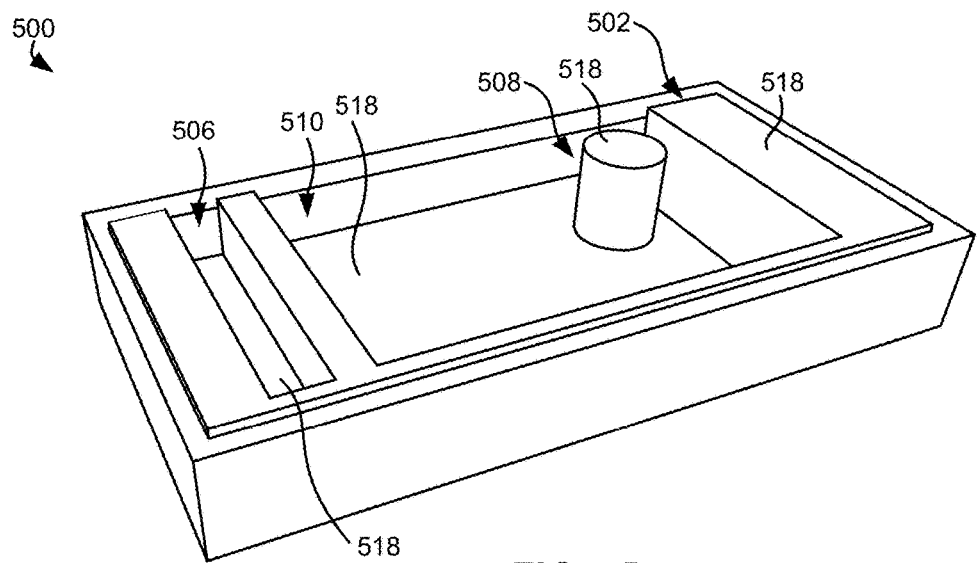
Figure 5E:
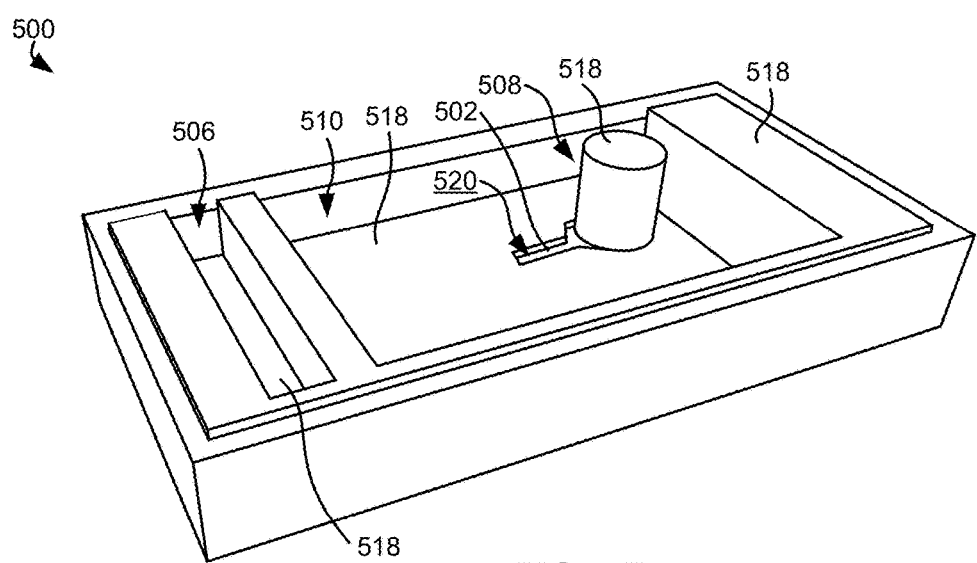
Figure 5F:
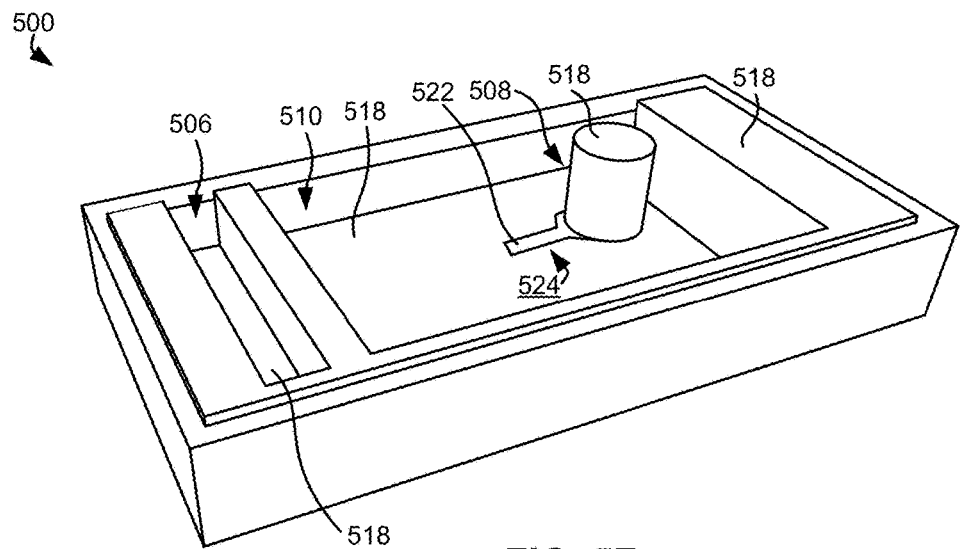
Figure 5G:
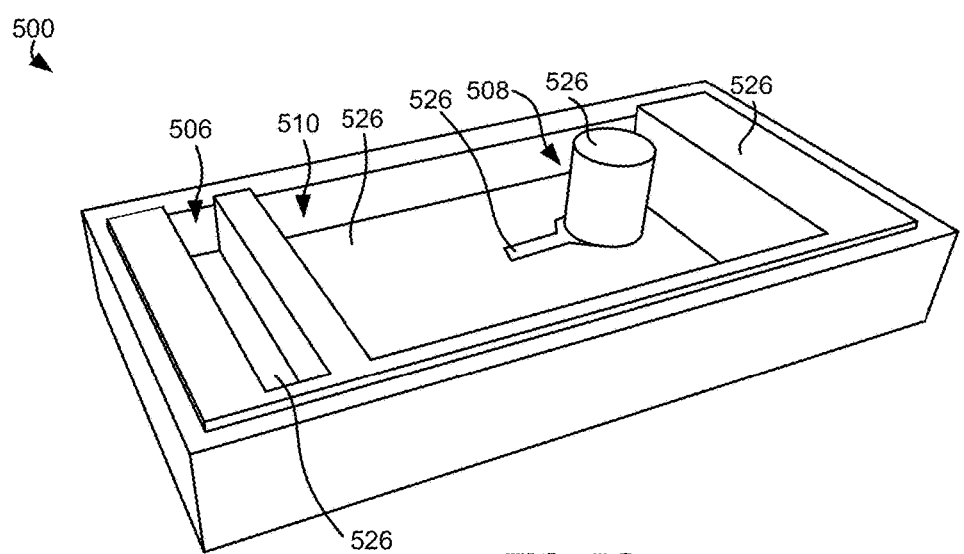
Figure 5H:
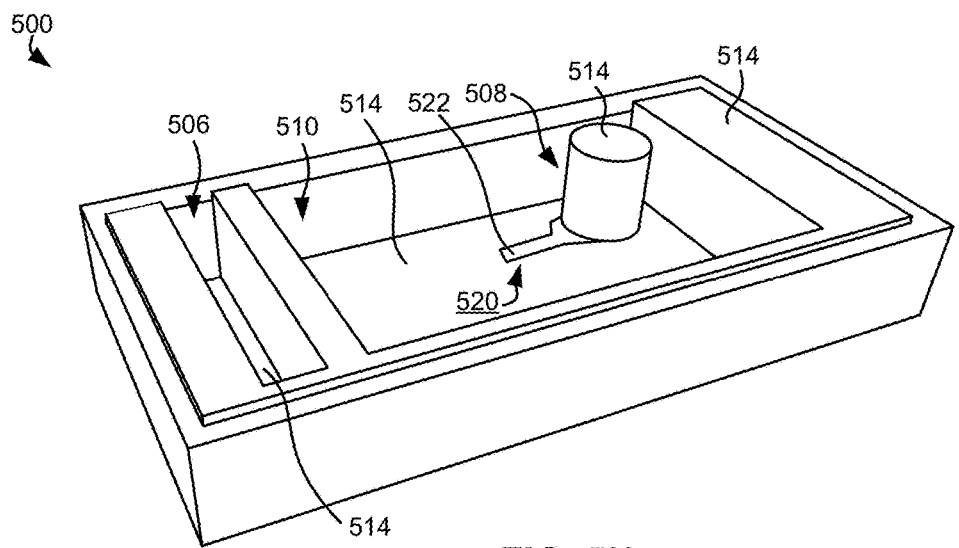
Figure 5I:
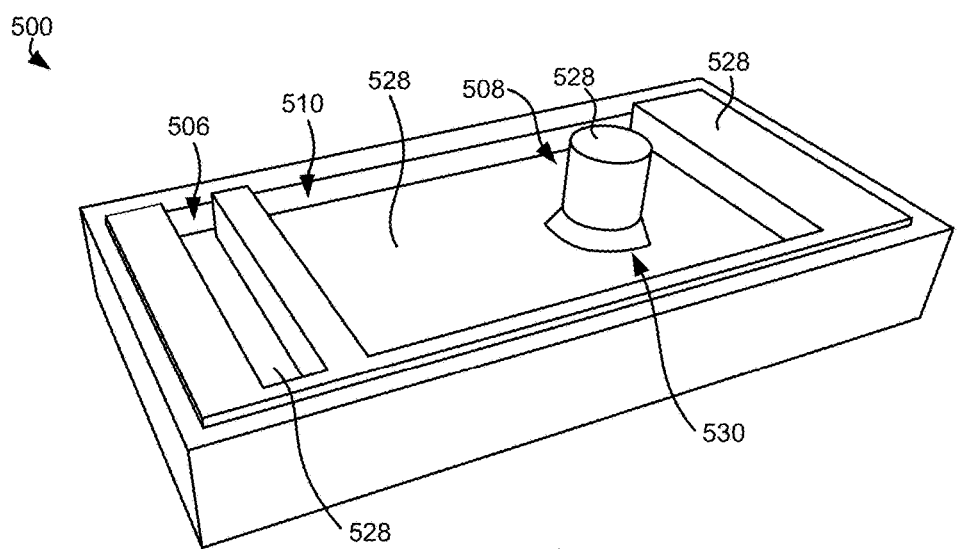
Figure 5J:
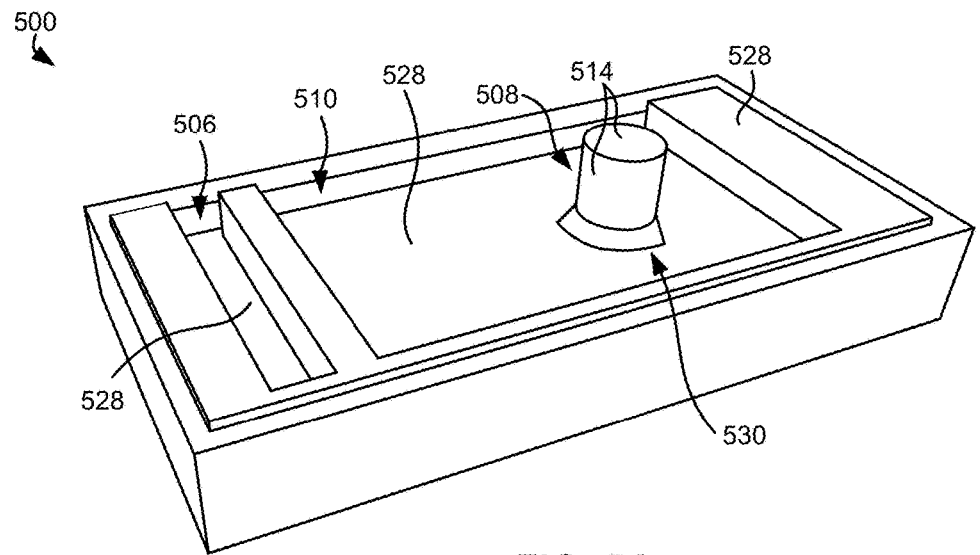
Figure 5K:
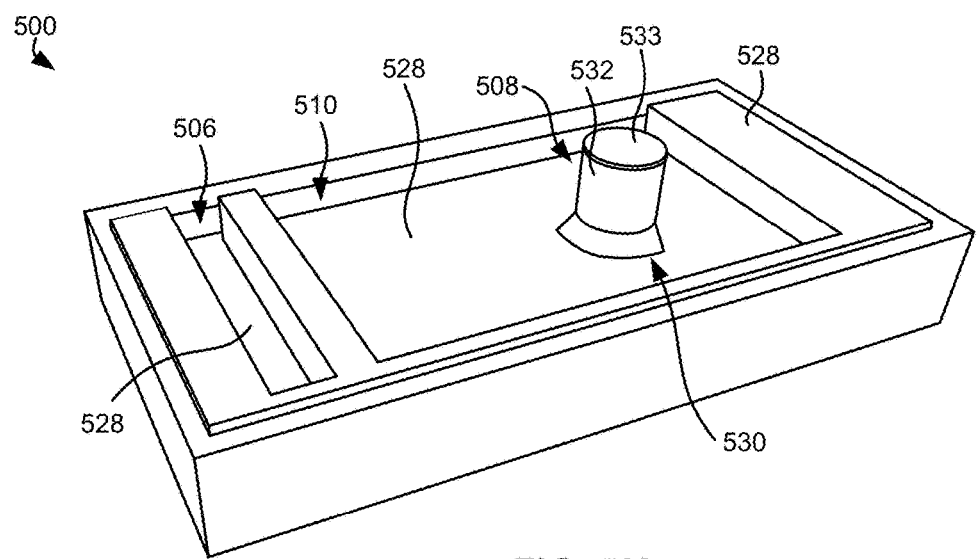
Figure 5L:
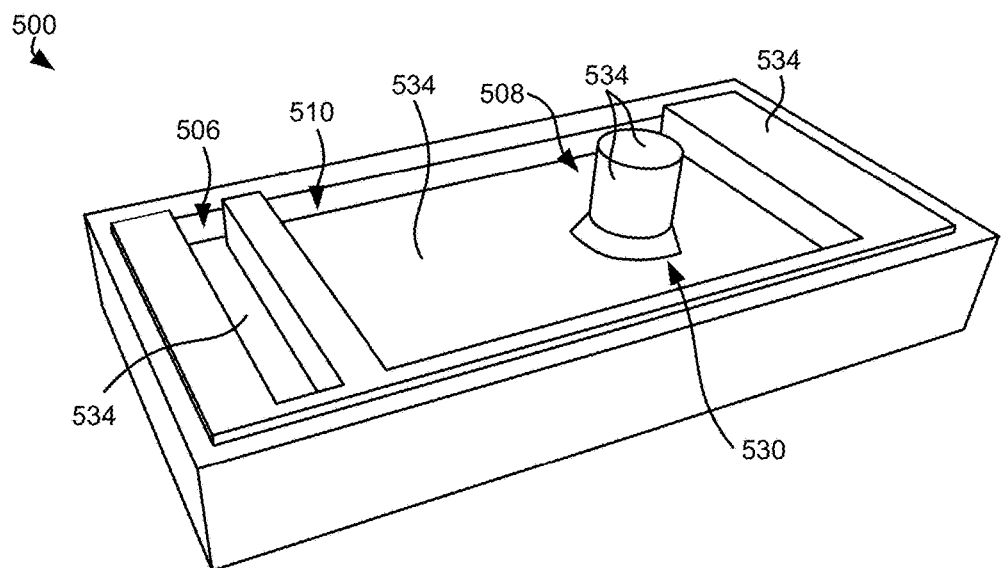
Figure 5M:
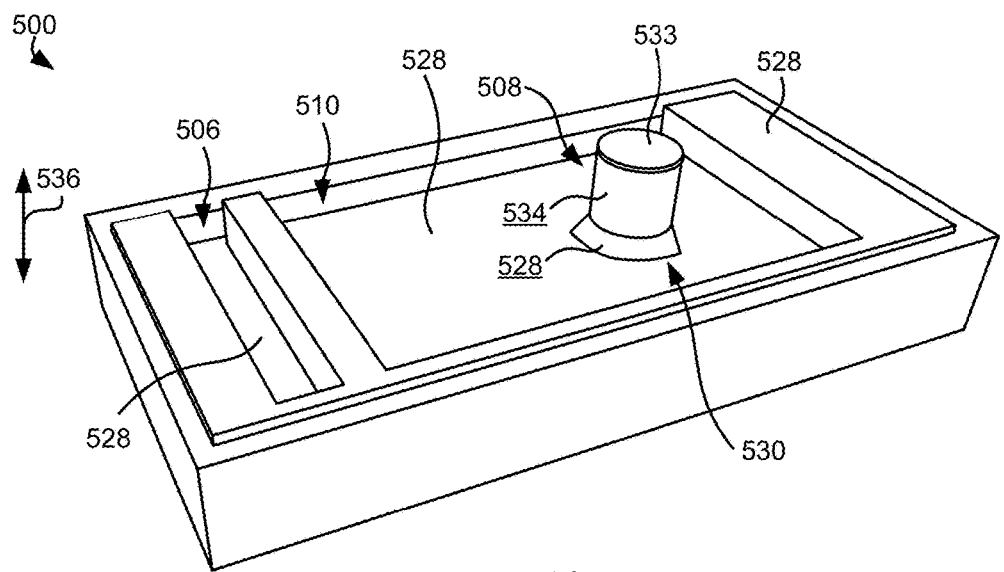
Figure 5N:
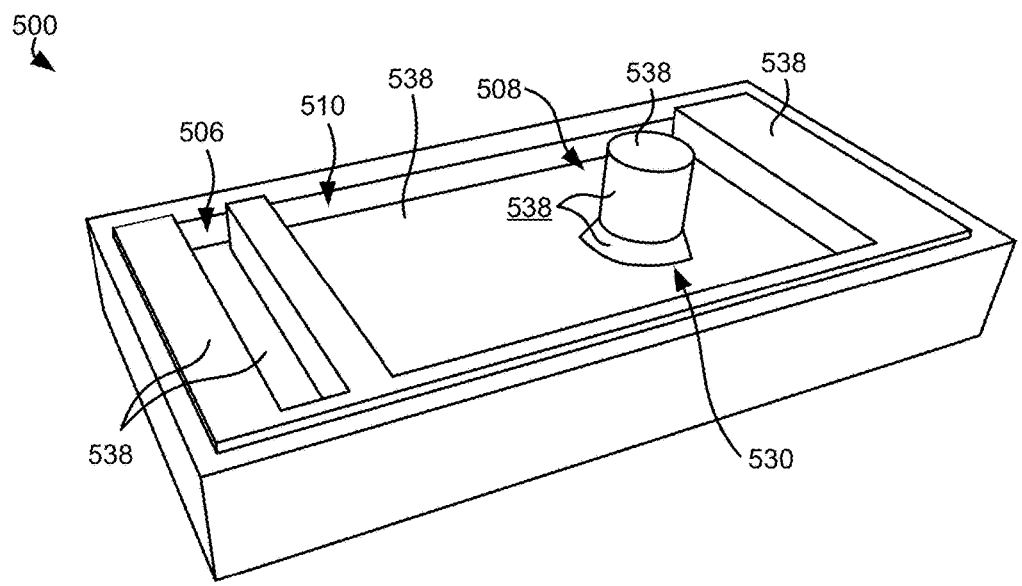
Figure 5O:
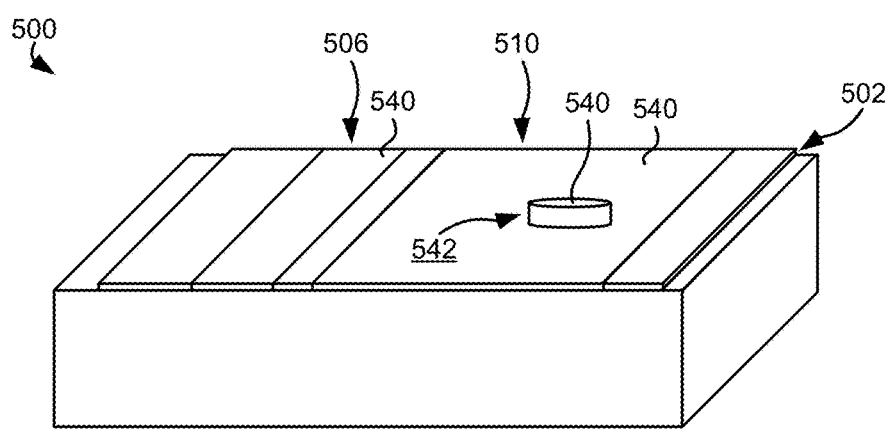
Figure 5P:
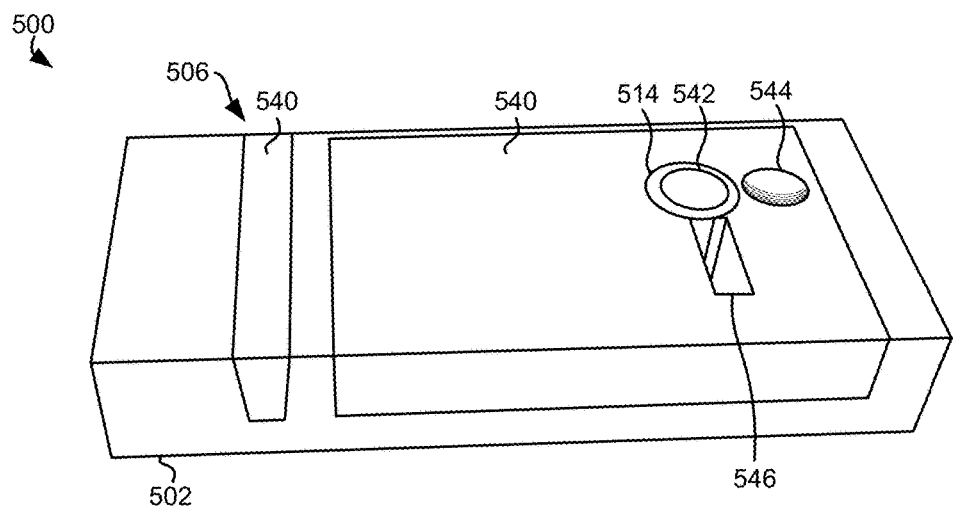
Figure 5Q:
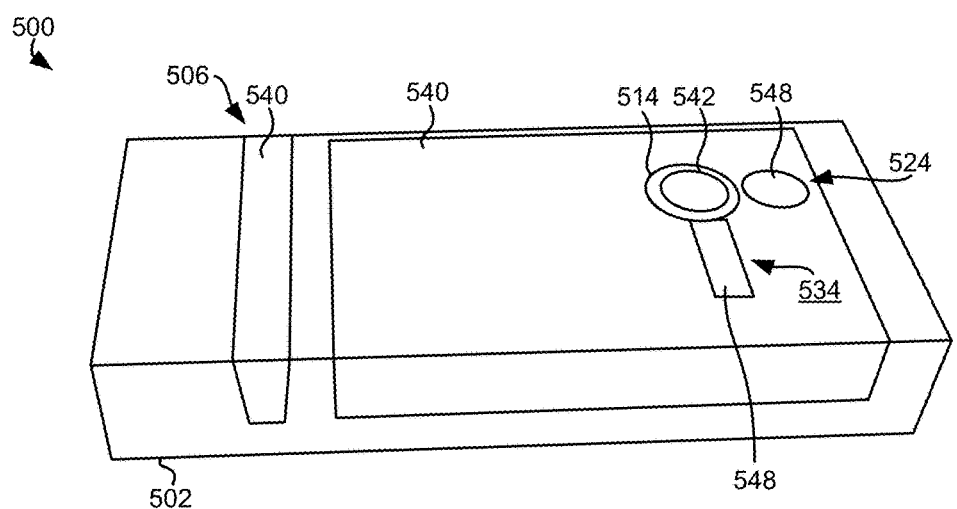
Figure 5R:
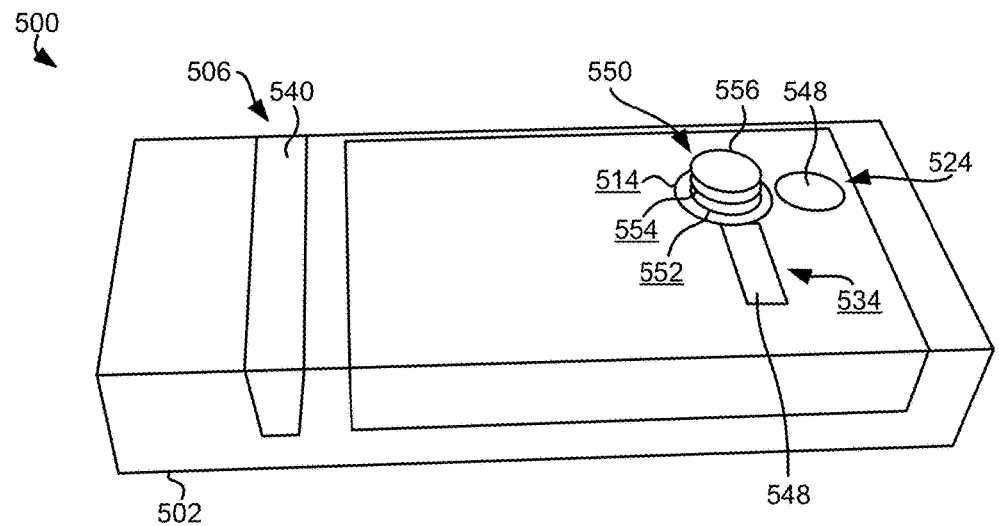

Looking now to FIGS. 5A-5R, various processes of an exemplary fabrication method 500 for forming a vertical channel transistor is illustrated in accordance with one embodiment. The method 500 may be performed in accordance with the present invention in any of the environments depicted in FIGS. 2-4B, among others, in various embodiments. Of course, more or less operations than those specifically described in FIGS. 5A-5R may be included in method 500, as would be understood by one of skill in the art upon reading the present descriptions.

Each of the steps of the method 500 may be performed by any suitable component of the operating environment. For example, in various embodiments, the method 500 may be partially or entirely performed by a controller, a processor, etc., or some other device having one or more processors therein which is able to communicate with (e.g., send commands to and/or receive information from) various fabrication components which would be apparent to one skilled in the art after reading the present description. The processor, e.g., processing circuit(s), chip(s), and/or module (s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art. Moreover, it should be noted that the various approaches described in relation to method 500 may be used to form any desired type of complementary metal-oxide-semiconductor CMOS and/or MOS devices and/or Bipolar junction devices.

As shown in FIG. 5A, method 500 begins with a solid block of substrate material 502. As described above, the solid block of substrate material 502 preferably includes silicon, e.g., such as crystalline silicon, but may include any desired material depending on the approach.

A thin oxide layer 512 is preferably formed on the exposed surfaces of the substrate material 502. The oxide layer 512 may be formed using any desired process, e.g., such as thermal oxidation. Thus, depending on the specific substrate material 502 used, the oxide layer 512 may have an effect on the material characteristics of the substrate material 502. For example, at least a portion of a silicon substrate material 502 may be turned into silicon dioxide by the formation of the oxide layer 512.

Progressing to FIG. 5B, the substrate material 502 is shown as having recessed portions which define a shallow trench isolation (STI) region 506 and a vertical cylindrical pillar structure 508, also referred to herein as a "vertical cylinder 508". As mentioned above, because the vertical cylindrical pillar structure 508 is formed from a solid block of material (e.g., silicon), the vertical cylinder 508 may actually be an extension of the remainder of the substrate material 502. In other words, the vertical cylinder 508 may actually be the same layer as the substrate material 502. It should be noted that the top portion of the vertical cylinder 508 will eventually serve as the drain contact (or channel 410 as seen in FIGS. 4A-4B).

The vertical cylinder 508 may be formed from the substrate material 502 by applying a mask to an upper surface of the block of substrate material 502. The mask preferably defines the outer extents of the STI region 506, the outer extents of the recessed region 510 in which the vertical cylinder 508 located, and the vertical cylinder 508 itself. After applying the mask, an etching process may be employed to form the recessed regions 506, 510 of the substrate material 502, thereby defining the insulating STI region 506 and the vertical cylinder active region 508. Depending on the desired approach, any desired form of etching may be performed. Moreover, it should be noted that forming the STI region 506 may involve performing additional etching compared to the recessed region 510 in which the vertical cylinder 508 located, or vice versa depending on the approach. However, in some approaches which implement low voltage devices (e.g., such as MRAM devices), additional etching of region 506 may not be performed. In other words, only high voltage devices may include forming the additional depth of STI 506 regions of the substrate.

The dimensions of the vertical cylindrical pillar structure 508 formed may have an effect on the performance of the resulting transistor structure created. For instance, increasing the thickness (or cross-sectional diameter D measured in a plane perpendicular to the height of the vertical cylindrical pillar structure) of the vertical cylindrical pillar structure 508, may cause an increase in the amount of current the resulting transistor is able to pass therethrough. Thus, the amount of current the vertical cylindrical pillar structure 508 is able to pass to a MTJ sensor structure coupled thereto, may be adjusted by tuning the diameter of the vertical cylindrical pillar structure. Similarly, the height H of the vertical cylindrical pillar structure 508 may have a direct effect on the speed at which the resulting transistor structure is able to pass current therethrough. Specifically, the shorter the height H of the vertical cylindrical pillar structure 508, the quicker the vertical cylindrical pillar structure 508 is able to pass a current therethrough. Thus, the height H of the cylindrical pillar structure 508 may be selectively tuned to adjust a performance speed of the resulting memory array in which the final transistor structure (e.g., see FIG. 5R below) is implemented. According to an illustrative approach, which is in no way intended to limit the invention, by selectively adjusting the diameter and/or height of the vertical cylindrical pillar structure 508, the resulting transistor structure may be able to pass more than 3.25 times the current therethrough compared to conventional surface MOS transistor structures, e.g., as would be appreciated by one skilled in the art after reading the present description.

Moving to FIG. 5C, once the STI region 506 and vertical cylinder 508 are crafted, another thin layer of oxide 514 is preferably formed over all exposed surfaces of the resulting structure. Moreover, the oxide layer may be formed using any of the processes described above. In order to achieve a smoother horizontal, vertical and annular surfaces of the resulting structure shown in FIG. 5C, a short oxidation followed by etching of dielectric SiO2 processes may be implemented to remove any asperities that may have occurred when etching the substrate Si. Once the short wet etching process has concluded, another thin oxide layer may be formed by thermal oxidation, which may again be followed by a short etching process. These oxide growth and etching processes may be repeated any desired number of times such that a smooth, uniform layer of oxide is ultimately formed on the surface of the resulting structure shown in FIG. 5C. The repeated small (e.g., slight) thermal oxidation of particularly Si substrates and wet etching back causes the resulting Si surfaces to be clear of Silicon surface imperfections, thereby causing the resulting layer to have faster mobility and/or speed of current carrier electrons and/or holes, e.g., as would be appreciated by one skilled in the art after reading the present description.

A gate oxide layer 516 is also preferably formed above the silicon layer (see 512 in FIG. 5B above). Referring momentarily back to FIGS. 4A-4B, the oxide layer 412 desirably insulates the channel 410 from the cylindrical gate contact 414. Thus, returning to FIG. 5C, forming a gate dielectric layer 516 at least over the exposed surfaces of the vertical cylinder 508 is preferred. Depending on the approach, the final gate dielectric layer 516 may be formed by depositing and/or growing the layer on the exposed surfaces of the vertical cylindrical pillar structure 508. As a result, the thermally oxidized outer silicon surface of the vertical cylindrical pillar silicon structure 508 may improve the gate dielectric characteristics of the resulting structure, e.g., as will be described in further detail below. However, it should be noted that a silicon substrate induces (e.g. allows) the growth of an overlying SiO2 layer. Accordingly different dielectric materials may be deposited which include materials other than silicon dioxide.

Moving on to FIG. 5D, a spin-on-glass (SOG) 518 material is preferably coated on the exposed surfaces of the resulting structure illustrated in FIG. 5C above. Thus, the SOG 518 material may be coated over the thin oxide layer 512 and/or the gate oxide layer 516 seen in FIG. 5C. Returning to FIG. 5D, the SOG 518 coating may be applied using any desired process(es), e.g., such as spin coating. Moreover, the SOG 518 coating may include any desired type of SOG material, e.g., such as glass titanate, glass silica, compound SOG materials, etc. Moreover the SOG 518 base material may be doped in some approaches with additional materials, e.g., such as boron, phosphorus, zinc, silica, etc., depending on the desired approach.

Looking to FIG. 5E, the fabrication method 500 further includes depositing a source mask (not shown) over a majority of the SOG 518 coating. As suggested, the mask may cover (e.g., protect) a majority of the resulting structure shown in FIG. 5D above, except for a select area at the base of the vertical cylindrical pillar structure 508. Thus, after the source masking process has been executed, an etching process may be performed, e.g., according to any of the approaches described above. The etching process preferably removes a portion of the aforementioned SOG coating and underlying oxide layer such that the underlying substrate material 502 is exposed in the select area not covered by the source mask. Accordingly, the recesses removing the portion of the SOG coating and underlying oxide layer effectively forms a source contact recess 520 which abuts a base of the vertical cylindrical pillar structure 508 and extends to the substrate material 502.

An ion-implanting process is also preferably performed on the exposed portion of the substrate material 502 (which is preferably silicon) at a base of the source contact recess 520. As would be appreciated by one skilled in the art, ion implantation is a processes which inserts a smattering of atoms into a material to effect the characteristics thereof. For example, in approaches where the substrate material 502 is silicon, ion implanting may insert a smattering of boron and/or phosphorus atoms into the silicon crystal lattice structure of the substrate material 502, thereby providing control of the flow of electricity through the silicon substrate material 502.

Moving to FIG. 5F, a silicide material 522 (e.g., metal) is deposited into the source contact recess 520, thereby forming a source contact 524 at the base of the cylindrical pillar 508. Any desired type of silicide material 522 may be used to form the source contact 524, thereby resulting in a Moreover, any desired process of depositing the silicide material 522 in the source contact recess 520 may be implemented.

After the silicide material 522 has been deposited in the source contact recess 520, the ion implant process performed above in correspondence with FIG. 5E may desirably be activated. In other words, the effects of the ion implanting may be transposed into the respective materials. This activation of the ion implant process may be performed by conducting a rapid thermal anneal of the structure shown in FIG. 5E. Any desired type of rapid thermal anneal processes may be employed (e.g., conducted) depending on the desired approach.

Looking now to FIG. 5G, a second silicide material 526 (e.g., metal) is preferably deposited over the resulting structure. In other words, the second silicide material 526 (e.g., metal) may be deposited over the SOG 518 coating and the silicide material 522 in the source contact recess 520 seen in FIG. 5E above. The second silicide material 526 may be the same, similar, or different than the previous silicide material 522, e.g., depending on the desired approach.

Moreover, after the second silicide material 526 has been deposited, another rapid thermal anneal process is preferably performed on the structure shown in FIG. 5G. By performing another rapid thermal anneal process on the structure, the desirable properties of the second silicide material 526 may be translated to the underlying layers, such as the top of the cylinder thereby resulting in easy flow of current through the cylinder's top and/or easy contact of the top of the cylinder to any other metallic layer deposited thereon. Furthermore, depending on the approach, any desired type of rapid thermal anneal processes may be conducted.

Proceeding to FIG. 5H, method 500 may next include stripping off the second silicide material (526 in FIG. 5G) as well as the SOG coating (518 in FIG. 5F). As a result, the thin layer of oxide 514 (previously seen in FIG. 5C) and the silicide material 522 in the source contact recess 520 are exposed again. Furthermore, as shown in FIG. 5I, a second SOG layer 528 is coated over the thin layer of oxide 514 and the silicide material 522 of FIG. 5H. Looking to the base of the vertical cylindrical pillar structure 508, the process of coating the second SOG layer 528 causes an angled collar 530 of the SOG material to form at the base of the vertical cylindrical pillar structure 508. This angled collar 530 may form as a result of the coating processes implemented to apply the second SOG layer 528 and/or the material used in the second SOG layer 528.

Referring now to FIG. 5J, a reactive-ion etching process is preferably performed to remove the second SOG layer 528 from the vertical sides and top surface of the vertical cylindrical pillar structure 508. Accordingly, the underlying the thin layer of oxide 514 (previously seen in FIG. 5H) is exposed again on the vertical sides and top surface of the vertical cylindrical pillar structure 508. Although a reactive-ion etching process is preferably performed to remove the second SOG layer 528 from the vertical sides and top surface of the vertical cylindrical pillar structure 508, any desired processes may be used to remove the second SOG layer 528. Moreover, this etching processes performed to remove the second SOG layer 528 from the vertical sides and top surface of the vertical cylindrical pillar structure 508 may further define the angled collar 530 at the base of the vertical cylindrical pillar structure 508.

Looking to FIG. 5K, a poly gate oxidation process is performed. This process may include forming a gate oxide dielectric layer 532 on the exposed surfaces of the vertical silicon cylindrical pillar structure 508, preferably at least on the vertical sides of the vertical cylindrical pillar structure 508. Moreover, an oxidization layer 533 is also formed on the top surface of the vertical cylindrical pillar structure 508. The gate oxidation layer 532 may be formed by depositing and/or growing the dielectric SiO2 layer on the exposed surfaces of the vertical cylindrical silicon pillar structure 508, e.g., as would be appreciated by one skilled in the art. This gate oxidation layer 532 may serve to isolate the electrically conductive layers on the vertical cylindrical pillar structure 508 from a gate contact formed later in the processing step, e.g., as will soon become apparent.

Moving to FIG. 5L, a doped polysilicon layer 534 is deposited over all exposed surfaces of the resulting structure shown. In other words, the doped polysilicon layer 534 is deposited over the second SOG layer 528 in the STI region 506 and the general recessed region 510, as well as over the surfaces of the vertical cylindrical pillar structure 508. Thus, the doped polysilicon layer 534 may be deposited over the exposed oxide layers 532, 533 on the vertical sides and the top of the cylindrical pillar, respectively. This doped polysilicon layer 534 may eventually serve as the gate contact material for the resulting transistor structure. Accordingly, an electrically conductive material (e.g., non-magnetic metal) may be used to connect the doped polysilicon 534 gate contact to a common drain line, e.g., as will be described in further detail below.

The polysilicon layer 534 may be doped differently depending on the type of transistor structure is desired. For example, in some approaches the polysilicon layer 534 may be an n-type doped material which may result in the transistor structure formed by method 500 to be an n-type transistor. In other approaches the polysilicon layer 534 may be a p-type doped material which may result in the transistor structure formed by method 500 to be a p-type transistor. Moreover, the polysilicon layer 534 may be doped using diffusion doping, ion implantation, in-situ doping, etc., which preferably occurs after actually depositing the polysilicon layer 534 on the structure.

According to preferred approaches, the polysilicon layer 534 may be deposited using a chemical vapor deposition process. However, any desired type of deposition process may be implemented to form the polysilicon layer 534. Moreover, the polysilicon layer 534 may have an exemplary deposition thickness of between about 200 angstroms (Å) and about 300 Å.

Method 500 further includes performing a removal process to remove the polysilicon layer 534 from all unneeded surfaces of the resulting structure shown in FIG. 5M except for the vertical sides of the vertical cylindrical pillar structure 508. Accordingly, the polysilicon layer 534 may only remain on the vertical sides of the vertical cylindrical pillar structure 508, thereby exposing the oxide layer 533 on the top surface of the vertical cylindrical pillar structure 508, and the second SOG layer 528 everywhere else. In order to ensure that the polysilicon layer 534 is selectively kept on the vertical sides of the vertical cylindrical pillar structure 508, but removed from the remaining surfaces of the structure, a removal process such as a maskless reactive-ion etching process may be implemented which etches off polysilicon from flat and somewhat sloped surfaces. The maskless reactive-ion etching process may only etch in the vertical direction 536, and not in an isotropic direction relative thereto at all, thereby desirably not effecting the vertical sides of the vertical cylindrical pillar structure 508.

As a result, the polysilicon layer 534 may have a resulting cylindrical, annular structure having poly characteristics of lower resistivity and texture. The remaining portion of the polysilicon layer 534 on the vertical sides of the vertical cylindrical pillar structure 508 will eventually serve as the circular gate material 414 seen in FIGS. 4A-4B. Accordingly, the performance characteristics of the polysilicon layer 534 in FIG. 5M may also be tuned to achieve further improved performance of the resulting transistor structure formed by method 500, e.g., as will soon become apparent.

Next, a poly silicide material 538 (e.g., metal) may be deposited over all exposed surfaces of the resulting structure, e.g., as shown FIG. 5N. Thus, the poly silicide material 538 may be deposited over remaining exposed portions of the second SOG coating 528, the oxide layer 533 on the top of the cylindrical pillar structure, and the doped polysilicon layer 534 on the vertical sides of the cylindrical pillar structure 508. The silicide material 538 may include any of the silicide materials described herein. Moreover, the silicide material 538 may be "poly" in that the material may actually be a polymetal, or polymetallic, substance which includes a combination of different metals and/or other materials, e.g., as would be appreciated by one skilled in the art. The poly silicide material 538 may also be deposited according to any desired process(es). According to one approach, the poly silicide material 538 may be deposited by a chemical vapor deposition process, an atomic layer deposition method, a sputtering technique, etc.

A rapid temperature anneal process is preferably performed on the structure in FIG. 5N having the poly silicide material 538 deposited thereon. The rapid temperature anneal process may desirably cause silicidation of the poly silicide material 538. Moreover, the properties of the poly silicide material 538 itself may be improved by the rapid temperature anneal process. Specifically, the resistance of portions of the resulting structure shown in FIG. 5N which have a polysilicon composition may effectively be reduced. Thus, the amount of current that may be passed through the transistor structure formed as a result of method 500 may be increased, thereby improving performance of the transistor as would be appreciated by one skilled in the art after reading the present description.

After the rapid temperature anneal process has been performed, portions of the poly silicide material 538 which did not react may be removed using an wet etching process, as would be appreciated by one skilled in the art after reading the present description.

Moving to FIG. 5O, method 500 also includes depositing a thin layer of silicon dioxide (not shown in the present frame of reference) before filling the STI and general recessed regions 506, 510 with another SOG material 540 over (e.g., directly onto) the silicon dioxide.

The SOG material 540 itself may be deposited into the STI and general recessed regions 506, 510 using any desired process(es). For example, in some approaches the SOG material 540 may be spin coated into the recessed regions 506, 510. Moreover, in the interest of achieving a smoother surface of the resulting structure shown in FIG. 5O, a short chemical-mechanical planarization (CMP) process may be implemented to remove any asperities that may have occurred when forming the SOG material 540, e.g., such as the extended region 524. Once the short CMP process has concluded, another thin layer of SOG material may be formed on the exposed surface of the resulting structure, which may again be followed by a short CMP process. These SOG deposition and CMP processes may be repeated any desired number of times such that a smooth, uniform layer of SOG material is ultimately formed on the surface of the resulting structure shown in FIG. 5O. In other words an upper surface of the SOG material 540 may be defined by one or more CMP processes. In some approaches, the one or more CMP processes may even expose an upper surface of the drain contact, e.g., as will soon become apparent.

Although only one transistor structure is shown as being formed in FIGS. 5A-5R, it should be noted that in other approaches, multiple transistor structures may be made simultaneously (e.g., at least somewhat in parallel). For instance, referring momentarily to FIG. 6, two different transistor structures 602, 604 are shown as being formed adjacent each other between a same pair of STI regions 606, e.g., as will be described in further detail below.

Referring now to FIG. 5P, the SOG material 540 has been removed in a controlled fashion (e.g., using one or more CMP processes) such that an upper surface of a drain contact 542 and a portion of the cylindrical oxide layer 514 which encircles the drain contact 542. This combination of having an oxide layer 514 which encircles the resulting drain contact 542 mimics the general structure shown above in reference to transistor structure 400. Specifically, referring momentarily back to FIGS. 4A-4B, the oxide layer 412 illustrated has a general cylindrical shape, and separates the vertical cylindrical channel 410 from the cylindrical gate contact 414 which encircles the oxide layer 412. Thus, the cylindrical oxide layer 514 which encircles the drain contact 542 as shown in FIG. 5P may desirably serve to insulate the drain contact 542 from the underlying polysilicon gate contact layer 534. As a result, a cylindrical drain contact and cylindrical gate contact may be formed such that the cylindrical gate contact encircles the cylindrical drain contact while maintaining functionality of the resulting transistor structure. As alluded to above, this achieves a reduced overall footprint of the resulting transistor structure, which in turn reduces the minimum achievable memory cell size. Furthermore, by reducing the minimum achievable memory cell size, the approaches described herein are able to increase data storage density significantly in comparison what is conventionally achievable.

Referring still to FIG. 5P, it should be noted that the drain contact 542 may actually be a top surface of the previously underlying vertical cylindrical pillar structure 508. However, the various processes included in method 500 may actually have desirably improved the performance of the original material from which the cylindrical pillar structure 508 was formed. For instance, although the block of material 502 originally used to form the cylindrical pillar structure 508 may have been silicon, the various polysilicon metals, oxide, etc. layers formed thereover, in combination with the various processing steps (e.g., such as rapid temperature anneal processes) may have actually caused the silicon to become doped with different materials As a result, the performance of the drain contact 542 may actually be improved compared to the properties of the original block of material 502 originally used to form the cylindrical pillar structure 508. Thus, the drain contact 542 may be able to pass more current through, and therefore operate more efficiently, causing an MRAM array in which it is implemented to operate more efficiently as well.

A source and gate masks individually or combined may be used to form vias 544, 546 which extend down to the underlying source and gate contacts 524, 534 respectively. In some instances, the vias 544, 546 may be formed using an etching processes, however the specific type of etching process may vary depending on the desired approach.

Moving on to FIG. 5Q, the vias 544, 546 are preferably filled with an electrically conductive material (e.g., metal) 548. It is also preferred that the material used to form the vias 544, 546 is a non-magnetic material such that the operability of a corresponding MTJ sensor stack is not compromised during use in a memory array. While in some approaches the conductive material 548 used to fill each of the vias 544, 546 may be the same, in other approaches each of the vias may be filled with a different electrically conductive material, e.g., to facilitate different performance thereof. The electrically conductive material 548 may be formed in the vias 544, 546 using a damascene process in some approaches. Moreover a CMP process may be used to define the upper surface of the electrically conductive materials 548 once they have been filled into the vias 544, 546 seen in FIG. 5P.

By filling the vias 544, 546 are preferably filled with an electrically conductive material (e.g., metal) 548, an electrically conductive connection is formed between each of the source and gate contacts 524, 534 respectively. Thus, the electrically conductive material 548 may effectively be considered an extension of the source and gate contacts 524, 534. Thus, although a majority of the formed vertical transistor structure is submerged in the SOG material 540, the transistor may be operated (e.g., activated) by applying voltages to each of the electrically conductive materials 548.

Furthermore, FIG. 5R illustrates a MTJ sensor stack 550 formed above the drain contact 542. Thus, a bottom layer of the MTJ sensor stack 550 is electrically coupled to the drain contact 542. Moreover, a voltage source (e.g., drain line) may be coupled to a top surface of the MTJ sensor stack 550. Thus, a voltage may be applied to the MTJ sensor stack 550 to cause a current to pass therethrough when the transistor structure is activated, e.g., as would be appreciated by one skilled in the art after reading the present description.

As shown, the MTJ sensor stack 550 may include at least a reference layer 552, a tunnel barrier layer 554, and a free layer 556 included therein. According to an illustrative approach, each of the reference layer 552, the tunnel barrier layer 554, and the free layer 556 may be formed full film, after which a selective removal processes (e.g., etching process) may be used to define the resulting structure of the MTJ sensor stack 550 shown in FIG. 5R.

As described above, the magnetic orientation of the free layer 556 may be selectively set by applying a current to the MTJ sensor stack 550 in one of two directions through the layers thereof. By selectively setting the magnetic orientation of the free layer 556, a bit of data (logical "1" or logical "0") is written to the MTJ sensor stack 550 and stored therein. Moreover, the MTJ sensor stack 550 may include any of the approaches described herein depending on the desired approach, e.g., such as those described in correspondence with FIGS. 2-3 above.

It should be noted that, although not specified in a number of the steps included in FIGS. 5A-5R, the same material(s), removal processes, material processing procedures, etc. that are performed in the general recessed region 510 may be performed in the STI region 506 as well. Moreover, it should also be noted that additional layers may be present. Moreover, unless otherwise specified, the various layers formed in method 500 and/or other embodiments included herein may be formed using known processes which would be apparent to one skilled in the art after reading the present description.

Figure 6:
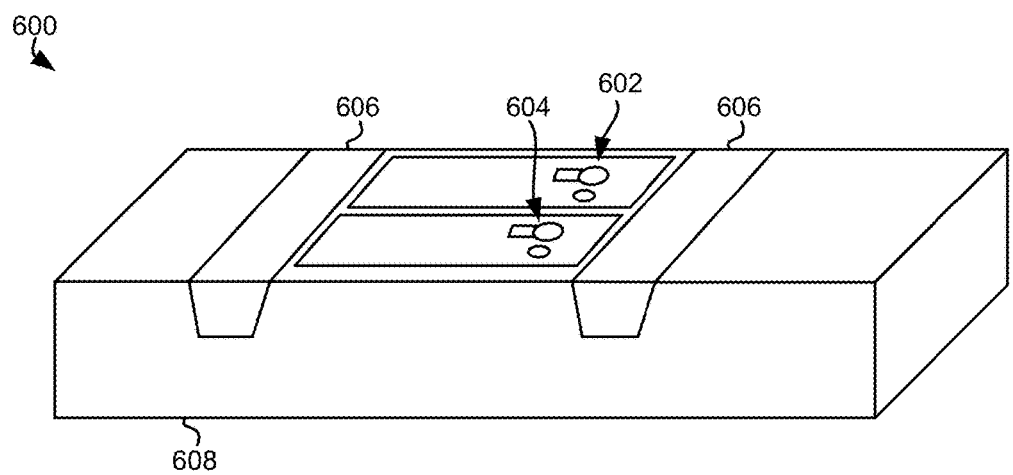
FIG. 6 is a fabrication configuration according to one embodiment.

Referring now to FIG. 6, a fabrication configuration 600 having two adjacent transistor structures 602, 604 is shown according to one embodiment. As an option, the present fabrication configuration 600 may be implemented in conjunction with features from any other embodiment listed herein, such as those described with reference to the other FIGS., such as FIGS. 5A-5R. However, such fabrication configuration 600 and others presented herein may be used in various applications and/or in permutations which may or may not be specifically described in the illustrative embodiments listed herein. Further, the fabrication configuration 600 presented herein may be used in any desired environment. Thus FIG. 6 (and the other FIGS.) may be deemed to include any possible permutation.

As mentioned above, the fabrication configuration 600 includes two adjacent transistor structures 602, 604 which are positioned between a pair of STI regions 606. It follows that in some approaches, multiple transistor structures may be formed simultaneously (e.g., at least somewhat in parallel) and adjacent one another from a single block of substrate material 608 which preferably includes silicon. Thus, various ones of the fabrication processes used to form the two adjacent transistor structures 602, 604 (e.g., see processes included in FIGS. 5A-5R above) may be performed on both structures at the same time (in parallel) from a single block of substrate material 608. However other ones of the processes used to form the two adjacent transistor structures 602, 604 may be performed on each of the structures individually. For example, one of the transistor structures 602 may be doped with n-type materials to form a resulting n-type transistor structure, while the other of the transistor structures 604 may be doped with p-type materials to form a resulting p-type transistor structure, e.g., as would be appreciated by one skilled in the art after reading the present description. Moreover, the block of substrate material used to form various components (submerged from view) included in the adjacent transistor structures 602, 604 is preferably silicon, but may include any desired material.

Figure 7:
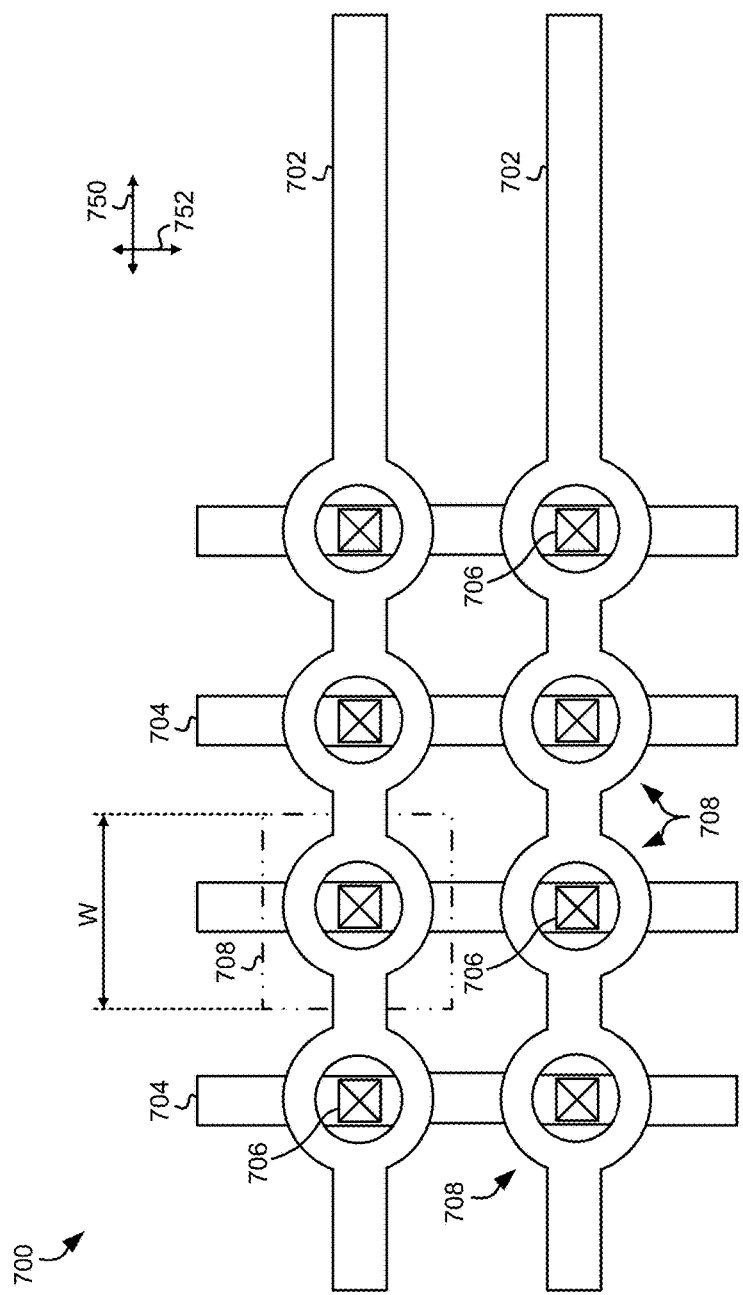
FIG. 7 is a partial representational layout view of a MRAM array according to one embodiment.

Referring now to FIG. 7, a MRAM array 700, is shown according to one embodiment. As an option, the present MRAM array 700 may be implemented in conjunction with features from any other embodiment listed herein, such as those described with reference to the other FIGS., such as FIGS. 2-6. However, such MRAM array 700 and others presented herein may be used in various applications and/or in permutations which may or may not be specifically described in the illustrative embodiments listed herein. Further, the MRAM array 700 presented herein may be used in any desired environment. Thus FIG. 7 (and the other FIGS.) may be deemed to include any possible permutation.

The MRAM array 700 includes a plurality of common word lines 702, a plurality of common source lines 704 and a plurality of common drain lines 706. As shown, each of the common word lines 702 extend in a direction 750 which is generally perpendicular to the direction 752 in which the common source lines 704 extend. Moreover, although only a cross-sectional portion of the common drain lines 706 are visible in the frame of reference depicted in FIG. 7, each of the common drain line 706 portions shown may extend out of the page (represented by each "X") and connect to a main portion of the common drain lines 706 which extend in a direction parallel to the direction 752 in which the common source lines 704 extend. However, in some approaches the main portion of the common drain lines 706 may extend in a direction parallel to the direction 750 in which the common word lines 702 extend.

Although not shown in FIG. 7, a vertical channel transistor having a vertical cylindrical pillar structure, e.g., according to any of the approaches described herein, may be positioned at each of the intersections of the common word lines 702, common source lines 704 and common drain lines 706. Accordingly, each of the vertical channel transistors may have a gate contact which is electrically coupled to one of the common word lines 702, a source contact which is electrically coupled to one of the common source lines 704, and a drain contact which is electrically coupled to a MTJ sensor stack which is in turn coupled to one of the common drain lines 706, e.g., according to any of the approaches described here. Thus, by selectively applying voltages to the various common word lines 702, common source lines 704 and/or common drain lines 706, any one or more of the vertical channel transistors coupled thereto may be activated and accordingly, data may be written to (and/or read from) a MTJ sensor stack coupled to the activated vertical channel transistors.

Moreover, as mentioned above, the reduced footprint achieved by each of the vertical channel transistors results in the data storage density of the overall MRAM array 700 to increase significantly. Looking to one specific cell 708 of the MRAM array 700, the cell 708 may have an effective width W of 2F, thereby resulting in the effective area of each of the cells in the MRAM array 700 2F×2F, or equivalently about $4F^2$. According to the present description, "F" represents the minimum feature size width defined by the lithography limits associated with the technology used to fabricate each of the cells. Thus, depending on the actual process(es) used to form the various cells 708, their effective size may vary depending on the value of F. This effective cell size of each of the cells 708 is significantly smaller than conventionally achievable which also results in the MRAM array 700 having performance characteristics which are improved significantly from conventional products, e.g., pertaining to processing speeds, storage density, efficiency, capability, etc.

With continued reference to FIG. 7, the various different memory cells 708 are arranged in a grid-like fashion. In other words, the different memory cells 708 are oriented in rows and columns which are substantially perpendicular to each other. This grid-like organization of the different memory cells 708 provides an efficient use of space and allows for the memory density of the resulting MRAM array 700 to be maximized. However, it should be noted that this grid-like arrangement of the memory cells 708 shown in FIG. 7 is in no way intended to limit the invention. Rather, the memory cells 708 and/or any of the lines 702, 704, 706 may be arranged differently depending on the desired approach.

The grid-like arrangement of the cells 708 (and transistors included therein) forms distinct columns and rows which extend throughout the MRAM array 700. Moreover, the columns and rows are interleaved such that each of the cells 708 are part of a defined row as well as a defined column. Thus, a specific one of the cells 708 may be individually identified given the row and column which it is located in. Although a specific number of columns and rows are illustrated in the present embodiment, any desired number of rows and/or columns may be implemented in order to scale the size of (e.g., the number of memory cells in) the MRAM array 700, and thus the storage capacity of the MRAM array 700. According to an example, hundreds, thousands, millions, etc. of cells 708 (each having a transistor and MTJ sensor stack pairing) may be organized in various rows and columns which extend perpendicularly relative to each other.

Furthermore, although not shown in the present embodiment, each of the common word lines 702, the common source lines 704 and the common drain lines 706 may be coupled to (e.g., in electrical communication with) a respective multiplexer. Moreover, each of the respective multiplexers may be coupled to a central controller. However, it should be noted that any one or more of these lines 702, 704, 706 may extend to any desired electrical component. The multiplexers may serve as an electrical circuit which is used to control a voltage that is applied to each of the respective lines 702, 704, 706, e.g., using logic gates for instance. Similarly, the controller may be configured to perform various processes which effect the voltages applied by the multiplexers to each of the respective lines 702, 704, 706, and in turn, the different terminals of the various transistors in each of the cells 708.

Moreover, by acting as a voltage generator, the multiplexers may be configured to counteract signal dampening experienced in the respective lines 702, 704, 706 coupled thereto. In other approaches, one or more of the multiplexers may serve as a sense amplifier in addition to a voltage generator. As a result, each of the multiplexers may be able to perform a read operation by receiving a signal from various ones of the transistors in the various cells 708, as well as perform write operations by applying a desired voltage to the respective lines 702, 704, 706 coupled thereto.

It follows that various ones of the approaches described herein are able to significantly increase the performance of transistor structures while also reducing the effective footprint thereof. As a result MRAM arrays implementing these transistor structures in combination with MTJ sensor stacks may desirably be able to achieve a resulting data storage density, performance efficiency, transistor reliability, etc. which are greater than what has been conventionally achievable. Moreover, specific characteristics of the transistor structures may be selectively tuned by adjusting the dimensions of vertical cylindrical pillar structures used therein, materials included in the transistor structure, fabrication processes used when forming the transistor structures, etc.

The description herein is presented to enable any person skilled in the art to make and use the invention and is provided in the context of particular applications of the invention and their requirements. Various modifications to the disclosed embodiments will be readily apparent to those skilled in the art and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

In particular, various embodiments of the invention discussed herein are implemented using the Internet as a means of communicating among a plurality of computer systems. One skilled in the art will recognize that the present invention is not limited to the use of the Internet as a communication medium and that alternative methods of the invention may accommodate the use of a private intranet, a Local Area Network (LAN), a Wide Area Network (WAN) or other means of communication. In addition, various combinations of wired, wireless (e.g., radio frequency) and optical communication links may be utilized.

The program environment in which one embodiment of the invention may be executed illustratively incorporates one or more general-purpose computers or special-purpose devices such hand-held computers. Details of such devices (e.g., processor, memory, data storage, input and output devices) are well known and are omitted for the sake of clarity.

It should also be understood that the techniques of the present invention might be implemented using a variety of technologies. For example, the methods described herein may be implemented in software running on a computer system, or implemented in hardware utilizing one or more processors and logic (hardware and/or software) for performing operations of the method, application specific integrated circuits, programmable logic devices such as Field Programmable Gate Arrays (FPGAs), and/or various combinations thereof. In one illustrative approach, methods described herein may be implemented by a series of computer-executable instructions residing on a storage medium such as a physical (e.g., non-transitory) computer-readable medium. In addition, although specific embodiments of the invention may employ object-oriented software programming concepts, the invention is not so limited and is easily adapted to employ other forms of directing the operation of a computer.

The invention can also be provided in the form of a computer program product including a computer readable storage or signal medium having computer code thereon, which may be executed by a computing device (e.g., a processor) and/or system. A computer readable storage medium can include any medium capable of storing computer code thereon for use by a computing device or system, including optical media such as read only and writeable CD and DVD, magnetic memory or medium (e.g., hard disk drive, tape), semiconductor memory (e.g., FLASH memory and other portable memory cards, etc.), firmware encoded in a chip, etc.

A computer readable signal medium is one that does not fit within the aforementioned storage medium class. For example, illustrative computer readable signal media communicate or otherwise transfer transitory signals within a system, between systems e.g., via a physical or virtual network, etc.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A method of forming a cylindrical vertical transistor, comprising:
  forming a cylindrical pillar from a single block of silicon;
  forming an oxide layer over an exterior of the cylindrical pillar and exposed surfaces of the block of silicon;
  coating the oxide layer with a spin-on-glass (SOG);

depositing a source mask over a majority of the SOG coating;
removing a portion of the SOG coating and underlying oxide layer, the portion being defined by the source mask, wherein removing the portion of the SOG coating and underlying oxide layer forms a source contact recess which abuts a base of the cylindrical pillar and extends to the silicon block therebelow;
ion-implanting the exposed silicon substrate at a base of the source contact recess; and
depositing a silicide material in the source contact recess, thereby forming a source contact;
activating the ion-implanting by performing a rapid thermal anneal procedure;
depositing a second silicide material over the SOG coating and the source contact;
performing a second rapid thermal anneal procedure;
removing the second silicide material;
removing a remainder of the SOG coating;
coating the oxide layer with a second SOG; and
remove the second SOG coating from vertical sides of the cylindrical pillar and a top of the cylindrical pillar.

2. The method as recited in claim 1, wherein the second SOG coating forms an angled collar at a base of the cylindrical pillar.

3. The method as recited in claim 1, wherein the second SOG is removed using a reactive ion etching process.

4. The method as recited in claim 1, comprising:
depositing doped polysilicon over the second SOG coating and the exposed oxide layer on the vertical sides and the top of the cylindrical pillar; and
removing the doped polysilicon except from the vertical sides of the cylindrical pillar,
wherein the doped polysilicon deposited on the vertical sides of the cylindrical pillar form a gate contact.

5. The method as recited in claim 4, wherein the doped polysilicon is removed using a maskless reactive-ion etching process.

6. The method as recited in claim 4, wherein the doped polysilicon is deposited using a chemical vapor deposition process.

7. The method as recited in claim 4, wherein a thickness of the deposited doped polysilicon is between about 200 angstroms (Å) and about 300 Å.

8. The method as recited in claim 4, comprising:
depositing a poly silicide material over: the second SOG coating, the oxide layer on the top of the cylindrical pillar, and the doped poly on the vertical sides of the cylindrical pillar;
performing a third rapid thermal anneal procedure; and
removing portions of the poly suicide material that did not react to the third rapid thermal anneal procedure.

9. The method as recited in claim 8, comprising:
depositing silicon dioxide;
coating the silicon dioxide with a third SOG; and
defining an upper surface of the third SOG coat by performing a chemical-mechanical planarization process,
wherein the chemical-mechanical planarization process exposes a drain contact.

10. The method as recited in claim 9, comprising:
depositing a source and gate mask; and
simultaneously etching down to the gate contact and the source contact, thereby forming vias.

11. The method as recited in claim 10, comprising:
depositing a first conductive metallic material in the via which extends to the gate contact; and
depositing a second conductive metallic material in the via which extends to the source contact.

12. The method as recited in claim 11, wherein the first and second conductive metallic materials are non-magnetic.

13. The method as recited in claim 10, comprising:
forming a magnetic tunnel junction (MTJ) sensor stack above the drain contact, such that a first end of the MTJ sensor stack is electrically coupled to the drain contact.

14. A magnetic device, comprising:
a plurality of cylindrical vertical transistors formed using the method as recited in claim 13,
wherein a second end of the MTJ sensor stack in each of the cylindrical vertical transistors is coupled to a common drain line,
wherein the source contact in each of the cylindrical vertical transistors is coupled to a common source line,
wherein the gate contact in each of the cylindrical vertical transistors is coupled to a common word line.

* * * * *

UNITED STATES PATENT AND TRADEMARK OFFICE
CERTIFICATE OF CORRECTION

PATENT NO.         : 10,347,822 B1
APPLICATION NO.    : 15/857358
DATED              : July 9, 2019
INVENTOR(S)        : Gian Sharma et al.

Page 1 of 1

It is certified that error appears in the above-identified patent and that said Letters Patent is hereby corrected as shown below:

In the Claims

Column 22, Line 7 Claim 8: please replace "poly suicide material" with --poly silicide material--.

Signed and Sealed this
Eighteenth Day of February, 2020

Andrei Iancu
*Director of the United States Patent and Trademark Office*